US007984367B1

(12) United States Patent
Chaichanavong et al.

(10) Patent No.: US 7,984,367 B1
(45) Date of Patent: Jul. 19, 2011

(54) METHOD FOR ITERATIVE DECODING IN THE PRESENCE OF BURST ERRORS

(75) Inventors: Panu Chaichanavong, Mountain View, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 971 days.

(21) Appl. No.: 11/821,231

(22) Filed: Jun. 21, 2007

Related U.S. Application Data

(60) Provisional application No. 60/820,275, filed on Jul. 25, 2006, provisional application No. 60/821,653, filed on Aug. 7, 2006.

(51) Int. Cl.
*H03M 13/03* (2006.01)
(52) U.S. Cl. ....................................................... 714/788
(58) Field of Classification Search .................. 714/762, 714/786, 787–788, 792, 800; 375/267, 340–341, 375/295
See application file for complete search history.

(56) References Cited

U.S. PATENT DOCUMENTS

| 5,983,385 A * | 11/1999 | Khayrallah et al. .......... 714/755 |
| 6,360,345 B1 * | 3/2002 | Kim et al. ..................... 714/746 |
| 6,484,283 B2 * | 11/2002 | Stephen et al. ............... 714/786 |
| 6,952,457 B2 * | 10/2005 | Blankenship et al. ........ 375/340 |
| 7,191,377 B2 * | 3/2007 | Berens et al. ................. 714/755 |
| 7,240,276 B2 * | 7/2007 | Akamatsu ..................... 714/788 |
| 7,430,702 B2 * | 9/2008 | Taguchi ........................ 714/769 |
| 2005/0120286 A1 * | 6/2005 | Akamatsu ..................... 714/792 |

\* cited by examiner

*Primary Examiner* — Shelly A Chase

(57) ABSTRACT

Systems and methods for iterative decoding in the presence of burst errors are provided. The methods include acquiring extrinsic and channel information for received ECC-encoded data symbols, selecting a window including a subset of the received ECC-encoded symbols, determining the likelihood of a burst error in the window, and updating channel information for selected data symbols in the window. In one embodiment, burst error detection circuitry is used to determine the likelihood of a burst error in the window.

37 Claims, 17 Drawing Sheets

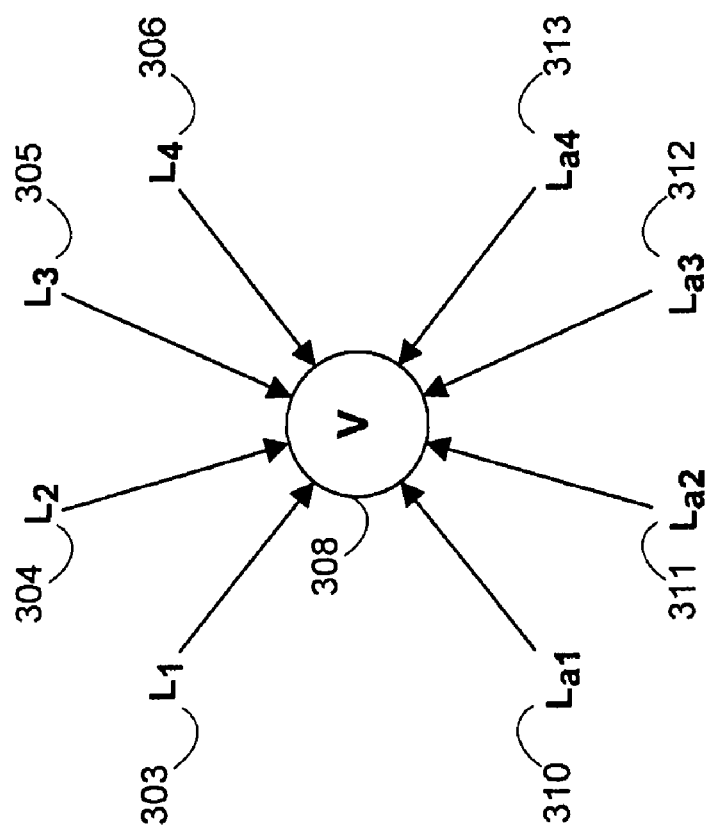

METHOD FOR ITERATIVE DECODING IN THE PRESENCE OF BURST ERRORS

CROSS REFERENCE TO RELATED APPLICATIONS

This claims the benefit of commonly-assigned U.S. Provisional Patent Application Nos. 60/820,275 and 60/821,653 filed Jul. 25, 2006 and Aug. 7, 2006, respectively, each of which is hereby incorporated by reference herein in its respective entirety.

BACKGROUND OF THE INVENTION

Embodiments of the invention generally pertain to systems and methods for processing data. In particular, embodiments of the invention pertain to systems and methods for decoding data.

Different decoders can be used to decode data to achieve different results. Recent codes, such as turbo or low-density parity check (LDPC) codes, typically rely on iterative decoding. Iterative decoders are a type of decoder in which the decoding task is performed repetitively until stopping criterion are achieved. These stopping criterion can be based on meeting or exceeding a specific degree of certainty or uncertainty in the results of the decoding.

More particularly, an iterative decoder takes information from a channel as input and performs the decoding by iteratively passing messages between computation nodes. The computation nodes represent the symbols within a codeword. The decoder takes the information from the channel, hereinafter referred to as "channel information," and passes it to a computation unit which takes into account the particular code structure. This computation unit then passes information from the computation unit, hereinafter known as "extrinsic information," back to each computation node. The computation nodes then use this extrinsic information together with the channel information to compute new messages to the computation unit. This process occurs repetitively until stopping criterion are satisfied.

Iterative decoders are very powerful in correcting random errors. Errors may occur for a number of reasons, including, for example, noise or interference in data transmission, scratches on a CD or DVD surface, defects in a magnetic medium, and/or other reasons. One particular type of error is called burst error. A burst error is a contiguous sequence of symbols, received over a data transmission channel, such that no contiguous sub-sequence of m symbols was received correctly. The integer parameter m is referred to as the guard band of the burst error. The last symbol in a burst and the first symbol in the following burst are accordingly separated by m correct bits or more.

The performance of iterative decoders suffers severely when burst errors occur. Thus, there is a continuing interest in improving the burst error correction capability of iterative decoders.

SUMMARY OF THE INVENTION

Disclosed herein are systems and methods for decoding data, including decoding data based on iterative codes such as low-density parity check codes or turbo codes. In particular, systems and methods are presented for decoding data in the presence of burst errors.

In one aspect of the invention, the method for decoding data begins by acquiring a first set of information and a second set of information for error correction code (ECC)-encoded data symbols, and selecting a window including a subset of the ECC-encoded data symbols. The first set of information may be extrinsic information, and the second set of information may be channel information. The likelihood of a burst error in the window may be determined based, at least in part, on a portion of the first set of information and a portion of the second set of information. Based on the determined likelihood of a burst error in the window, the second set of information for selected data symbols of the subset may be updated. Updating channel information may include erasing channel information for the selected data symbols. In various embodiments, the error correction code may be a low-density parity check code or it may be a turbo code.

According to one embodiment, selected steps of the method may be repeated. For example, the selecting a window, determining a likelihood of a burst error in the window, and updating channel information for selected data symbols of the subset in the window may be repeated. In some embodiments, the selecting, determining and updating is repeated until a completion condition is met. The completion condition may include performing the updating on all of the ECC-encoded data symbols.

According to the same embodiment, determining a likelihood of a burst error in the window includes several steps. These steps may include calculating extrinsic hard decision data based on a portion of the extrinsic information, and calculating channel hard decision data based on a portion of the channel information. Determining the likelihood of a burst error may then include selecting a portion of the data symbols from the subset such that the extrinsic hard decision data for respective data symbols of the portion of the data symbols is distinct from the channel hard decision data for respective data symbols of the portion of the data symbols. Determining the likelihood of a burst error may include determining whether one or more conditions have been met based on the selected portion of the data symbols. In one example, the one or more conditions includes exceeding a threshold for the size of the portion of the data symbols, where the size is the number of data symbols in the portion of data symbols from the subset. The threshold may be predetermined, and it may be adjusted based on information available from burst error detection circuitry.

In another embodiment, determining the likelihood of a burst error includes calculating the magnitude of extrinsic information for the portion of the data symbols selected from the subset, and the one or more conditions includes exceeding a threshold for the magnitude. The threshold may be predetermined, and it may be adjusted based on information available from burst error detection circuitry.

In yet another embodiment, determining the likelihood of a burst error in the window may comprise further steps. Determining the likelihood of a burst error in the window may include determining the most likely symbol value and second most likely symbol value for each data symbol in the portion of the data symbols based on the portion of the extrinsic information. Determining the likelihood of a burst error in the window may also include calculating the sum of the differences between extrinsic information corresponding to the most likely symbol value and extrinsic information corresponding to the second most likely symbol value for each data symbol in the portion of the data symbols. The one or more conditions may include exceeding a selected threshold for the sum of the differences. The selected threshold may be conditionally adjusted based on selected information available from burst error detection circuitry.

In yet another embodiment, determining the likelihood of a burst error in the window may comprise further steps. Determining the likelihood of a burst error in the window may include determining the most likely value for each data symbol in the portion of data symbols based on the portion of the extrinsic information, and the most likely symbol value for each data symbol in the portion of the data symbols based on the portion of the channel information. Determining the likelihood of a burst error in the window may also include calculating the sum of the differences between extrinsic information corresponding to the most likely symbol value for a data symbol based on the portion of the extrinsic information and extrinsic information corresponding to the most likely symbol value for that same data symbol in the portion of the data symbols. The one or more conditions may include exceeding a selected threshold for the sum of the differences. The selected threshold may be conditionally adjusted based on selected information available from burst error detection circuitry.

According to another aspect, the invention provides a system including an error correction coding decoder, a receiver, a selection module, a determination module, an updating module, and optionally, burst error detection circuitry. The error correction coding decoder acquires a first set of information for the error correction code (ECC)-encoded data symbols. The receiver acquires a second set of information for the plurality of ECC-encoded data symbols. The first set of information may be extrinsic information, and the second set of information may be channel information. The selection module selects a window including a subset of the received ECC-encoded data symbols. The determination module determines the likelihood of a burst error in the window based, at least in part, on a portion of the first set of information and a portion of the second set of information. The updating module updates the second set of information for selected data symbols of the subset based on the likelihood of a burst error in the window. Updating may include erasing the second set of information for the selected data symbols. In various embodiments, the error correction code may include a low-density parity-check code or a turbo code.

According to one embodiment, the determination module performs several steps to determine the likelihood of a burst error. First, the determination module calculates extrinsic hard decision data based on the portion of the extrinsic information, and channel hard decision data based on the portion of the channel information. The determination module selects a portion of the data symbols from the subset such that the extrinsic hard decision data for respective data symbols of the portion of the data symbols is distinct from the channel hard decision data for respective data symbols of the portion of the data symbols. The determination module may then determine whether one or more conditions have been met based on the portion of the data symbols.

In one example, the condition used by the determination module includes exceeding a threshold for a size of the portion of the data symbols, where the size is the number of data symbols in the portion of data symbols from the subset. In another example, the condition includes exceeding a threshold for the magnitude of the extrinsic information for the portion of the data symbols. In a further example, the condition includes exceeding a threshold for the difference between the extrinsic information corresponding to a first data symbol in the selected subset and the extrinsic information corresponding to a second data symbol in the selected subset.

According to another embodiment, the determination module further comprises burst error detection circuitry, which may provide information on the location of burst errors. Based on information provided by the burst error detection circuitry, the determination module may adjust the thresholds described above (e.g., the threshold for a size of the portion of the data symbols, the threshold for the magnitude of the extrinsic information for the portion of the data symbols, and the threshold for the difference between the extrinsic information corresponding to a first data symbol in the selected subset and the extrinsic information corresponding to a second data symbol in the selected subset).

According to another embodiment, the determination module may perform further steps to determine the likelihood of a burst error. The determination module may determine the most likely symbol value and the second most likely symbol value for each data symbol in the portion of the data symbols based on the portion of the extrinsic information. The determination module may calculate the sum of the differences between extrinsic information corresponding to the most likely symbol value and extrinsic information corresponding to the second most likely symbol value for each data symbol in the portion of the data symbols. The one or more conditions may include exceeding a selected threshold for the sum of the differences. The selected threshold may be conditionally adjusted based on selected information available from burst error detection circuitry.

According to another embodiment, the determination module may perform further steps to determine the likelihood of a burst error. The determination module may determine the most likely symbol value for each data symbol in the portion of the data symbols based on the portion of the channel information, as well as the most likely symbol value for each data symbol in the portion of the data symbols based on the portion of the channel information. The determination module may calculate the sum of the differences between extrinsic information corresponding to the most likely symbol value for a data symbol based on the portion of the extrinsic information and extrinsic information corresponding to the most likely symbol value for that same data symbol based on the portion of the channel information for each data symbol in the portion of the data symbols. The one or more conditions may include exceeding a selected threshold for the sum of the differences. The selected threshold may be conditionally adjusted based on selected information available from burst error detection circuitry.

In another aspect of the invention, the invention includes means for decoding data including means for acquiring extrinsic information and channel information for error correction code (ECC)-encoded data symbols, means for selecting a window including a subset of the ECC-encoded data symbols, means for determining the likelihood of a burst error in the window, and means for updating the channel information. The means for determining the likelihood of a burst error in the window determines the likelihood based, at least in part, on a portion of the extrinsic information and a portion of the channel information. Based on the determined likelihood of a burst error in the window, the means for updating channel information may update channel information for selected data symbols of the subset. The means for updating channel information may include means for erasing channel information for the selected data symbols. In various embodiments, the error correction code may be a low-density parity check code or it may be a turbo code.

The means for determining a likelihood of a burst error in the window includes means for calculating extrinsic hard decision data, means for calculating channel hard decision data, means for selecting a portion of the data symbols in the window, and means for determining whether one or more conditions have been satisfied. The means for calculating extrinsic hard decision data calculates extrinsic hard decision data based on a portion of the extrinsic information, and the means for calculating channel hard decision data calculates channel hard decision data based on a portion of the channel information. The means for selecting a portion of the data symbols from the subset in the window selects data symbols such that the extrinsic hard decision data for respective data symbols of the portion of the data symbols is distinct from the channel hard decision data for respective data symbols of the portion of the data symbols. The means for determining whether one or more conditions have been met may determine whether the one or more conditions have been met based on the selected portion of the data symbols. In one example, the means for determining whether one or more conditions have been met determines whether a threshold for the size of the portion of the data symbols has been exceeded, where the size is the number of data symbols in the portion of data symbols from the subset. The threshold may be predetermined, and means for adjusting the threshold may be provided based on information available from burst error detection circuitry.

In another embodiment, the means for determining the likelihood of a burst error includes means for calculating the magnitude of extrinsic information for the portion of the data symbols selected from the subset, and the means for determining whether one or more conditions have been met determines whether a threshold for the magnitude has been exceeded. The threshold may be predetermined, and means for adjusting the threshold may be provided based on information available from burst error detection circuitry.

In yet another embodiment, means for determining the likelihood of a burst error includes means for calculating the difference between the extrinsic information corresponding to a first data symbol in the selected subset and the extrinsic information corresponding to a second data symbol in the selected subset, and the means for determining whether one or more conditions have been met determines whether a threshold for the difference has been exceeded. The threshold may be predetermined, and means for adjusting the threshold may be provided based on information available from burst error detection circuitry.

In yet another embodiment, the means for determining the likelihood of a burst error include means for determining the most likely symbol value and the second most likely symbol value for each data symbol in the selected portion of the data symbols. The means for determining the likelihood of a burst error may also include means for calculating the sum of the differences between extrinsic information corresponding to the most likely symbol value and extrinsic information corresponding to the second most likely symbol value for each data symbol in the portion of the data symbols. The means for determining whether one or more conditions have been met may determine whether a threshold for the sum of the differences has been exceeded. The threshold may be predetermined, and means for adjusting the threshold may be provided based on information available from burst error detection circuitry.

In yet another embodiment, means for determining the likelihood of a burst error include means for determining the most likely symbol value for each data symbol in the portion of the data symbols based on the portion of the extrinsic information and the means for determining the most likely symbol value for each data symbol in the portion of the data symbols based on the portion of the channel information. The means for determining the likelihood of a burst error may also include means for calculating the sum of the differences between extrinsic information corresponding to the most likely symbol value for a data symbol based on the portion of the extrinsic information and extrinsic information corresponding to the most likely symbol value for that same data symbol based on the portion of the channel information. The means for determining whether one or more conditions have been met may determine whether a threshold for the sum of the differences has been exceeded. The threshold may be predetermined, and means for adjusting the threshold may be provided based on information available from burst error detection circuitry.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3B shows an additional enlarged view of a symbol node;

DETAILED DESCRIPTION

The systems and methods of the invention generally relate to detecting errors associated with the communication and/or storage of data. In general, and as will be discussed in more detail below, a "channel" refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to herein as "errors." One particular type of error is called "burst error". A burst error is a contiguous sequence of symbols, received over a data transmission channel, such that no contiguous sub-sequence of m symbols was received correctly. The integer parameter m is referred to as the guard band of the burst error. The last symbol in a burst and the first symbol in the following burst are accordingly separated by m correct bits or more.

The systems and methods described herein employ data encoding and decoding to mitigate the occurrences of errors in data. "Encoding" generally refers to the process of generating data in a manner that facilitates subsequent detection and/or correction of errors in the data, and "decoding" generally refers to the counterpart process of detecting and/or correcting the errors. Coded information can be grouped into units called "codewords." Codewords may contain "symbols," which are groupings of one or more bits.

In the process of encoding and decoding data, different codes can be used to encode data to achieve different results. One class of codes, called error-correction codes (ECC), may be used to detect and/or correct errors. Error correcting codes are often used to correct errors which may occur during transmission or storage. In the disclosed systems and methods, error correction code-encoded (ECC-encoded) data symbols are processed. These ECC-encoded data symbols are associated with computation units called symbol nodes, which represent the ECC-encoded data symbols within a codeword.

The disclosed systems and methods perform decoding by iteratively passing information between each symbol node and a decoder. This information comprises two types of data: channel information and extrinsic information. Channel information refers to information obtained from one or more channels. Extrinsic information refers to any information obtained outside the context of a channel. This includes information produced by any determinations and/or computations in the course of the execution of the disclosed systems and methods.

Figure 1A:
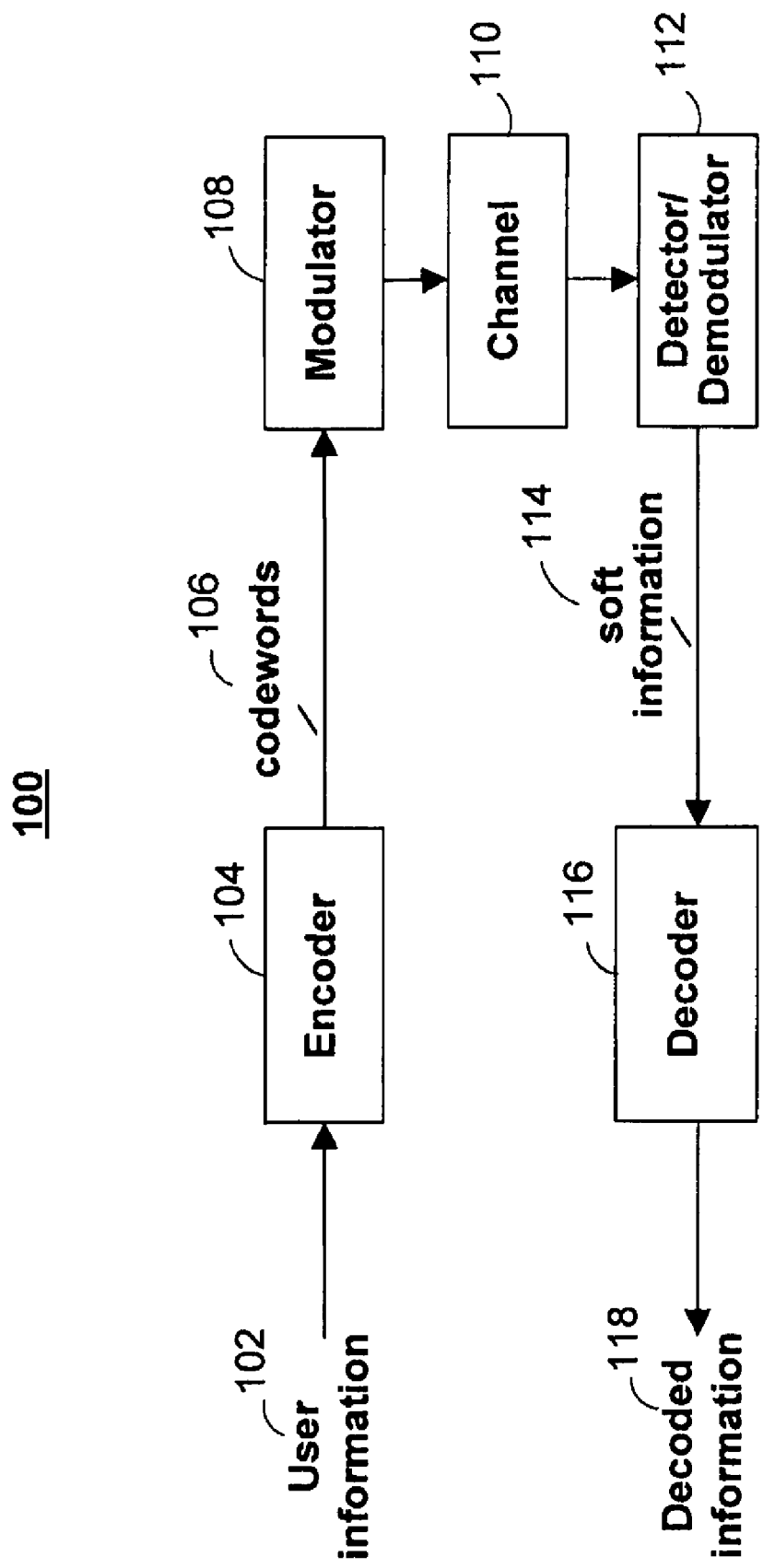
FIG. 1A shows an exemplary communication/storage system that implements a method for iterative decoding in the presence of burst errors.

FIG. 1A shows an exemplary communication/storage system 100 that employs a low density parity check (LDPC) code and implements a method for iterative decoding in the presence of burst errors. An LDPC code is a particular type of parity check code in which, generally, there are several parity check constraints and the number of variables in each parity check constraint is relatively small compared to the total number of bits in a codeword. In other embodiments, the iterative decoding method can be advantageous when applied to communication/storage systems that employ turbo codes. A turbo code employs a forward-error correction technique consisting of a concatenated code structure plus an iterative feedback algorithm. In various implementations, the iterative decoding method may be used in a system which aims to achieve maximal data transfer over a channel using iterative decoding.

User information 102 that is intended for communication/storage can be encoded by encoder 104 to generate coded information/codewords 106. A modulator 108 can configure the codewords 106 into a signal (not shown), which is passed to the channel 110. The modulator 108 can employ a number of modulation techniques known in the art, such as binary phase shift keying (BPSK), for example.

With continuing reference to FIG. 1A, a signal on the channel 110 can be received by a detector/demodulator 112. The detector/demodulator 112 can produce soft information 114 for the coded information represented by the received signal (not shown). As used herein, the term "soft information" refers to information that indicates the likelihood of a symbol value. The soft information 114 commonly includes probability values and log-likelihood ratios (LLRs). Decoder 116 receives the soft information 114 and uses the soft information 114 to attempt to recover the original user information 102. Decoder 116 preferably is a particular type of decoder that uses an iterative decoding technique. Decoder 116 produces decoded information 118, which may or may not include errors. If there are no errors in the decoded information 118, the decoded information 118 will be the same as the user information 102. Otherwise, the decoded information 118 will be different from the user information 102.

As described above, encoder 104 may be an iterative encoder, an iterative LDPC encoder, a turbo encoder, or any selected error correction code-encoding scheme. In addition, the decoder 116 may be a corresponding iterative decoder, iterative LDCP decoder, a turbo decoder, or any selected corresponding error correction code-decoding scheme based on iterative decoding.

Figure 1B:
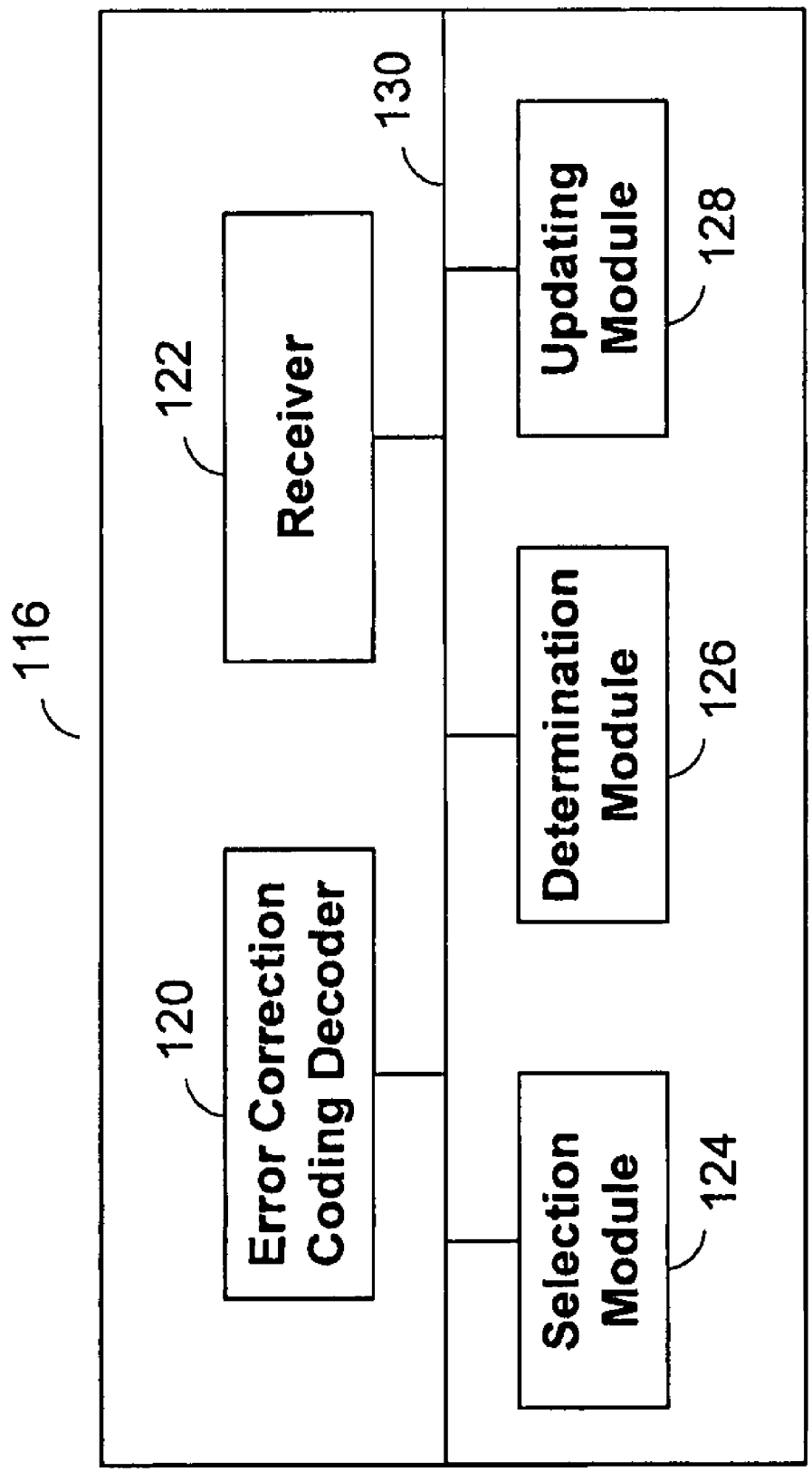
FIG. 1B depicts the decoder of FIG. 1A.

FIG. 1B depicts the decoder 116 of FIG. 1A. Decoder 116 includes an error correction coding (ECC) decoder 120, a receiver 122, a selection module 124, a determination module 126, and an updating module 128, which all exchange data through data bus 130. The ECC decoder 120 acquires extrinsic information for the ECC-encoded data symbols. The receiver 122 acquires information for the ECC-encoded data symbols. The selection module 124 selects a subset of ECC-encoded data symbols. The determination module 126 determines information about each data symbol in the subset. The updating module 128 updates information for data symbols in the subset. In various implementations, the ECC-decoder 120 and modules 124, 126, and 128 may include logic, a processor, or machine-readable media.

Figure 2:
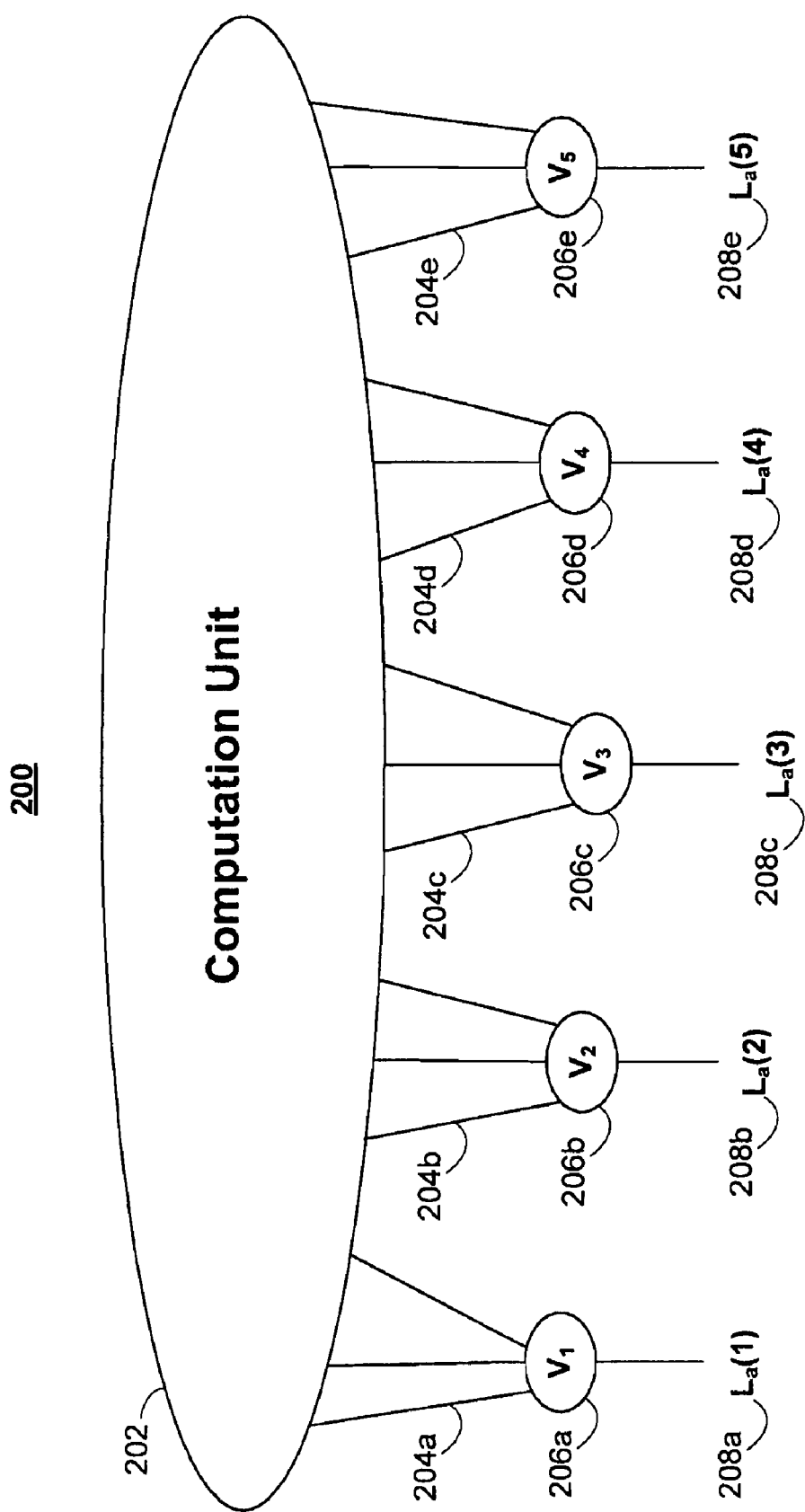
FIG. 2 shows a conceptual diagram of iterative decoding.

FIG. 2 shows a conceptual diagram 200 of iterative decoding, including a computation unit 202, a first set of information 204a-204e, symbol nodes 206a-206e, and a second set of information 208a-208e. The first set of information 204a-204e may be extrinsic information, or any suitable type of information. The second set of information 208a-208e may be channel information, or any suitable type of information. The second set of information 208a-208e is input to corresponding symbol nodes 206a-206e, respectively. The symbol nodes 206a-206e represent the ECC-encoded data symbols within a codeword, for example the codeword 106 of FIG. 1A. The second set of information 208a-208e input to the symbol nodes 206a-206e is passed to a computation unit 202. The computation unit 202 preferably uses a selected error correction code encoding structure to process the second set of information 208a-208e from the symbol nodes 206a-206e. After the computation unit 202 receives the second set of information 208a-208e from the symbol nodes 206a-206e, it preferably computes the first set of information 204a-204e for the symbol nodes 206a-206e. According to one embodiment, the computation unit 202 determines the first set of information 204a-204e based on the error correction code by which the data symbols represented by the symbol nodes 206a-206e are encoded. The symbol nodes 206a-206e then use their respective first set of information 204a-204e together with their respective second set of information 208a-208e to create a new first set of information (not shown), which is sent to the computation unit 202. This process may be repeated until one or more stopping conditions are satisfied.

In various embodiments, iterative decoding as represented in diagram 200 may include any selected number of symbol nodes 206a-206e, including 1, 2, 3, 4, 5, 8, 10, 15, 20, 30, 40, 50, 75, 100, 200, 500, 1000 or more than 1000 symbol nodes. Additionally, as described above, the error correction code may be, for example, an LDCP code or a turbo code.

Figure 3A:
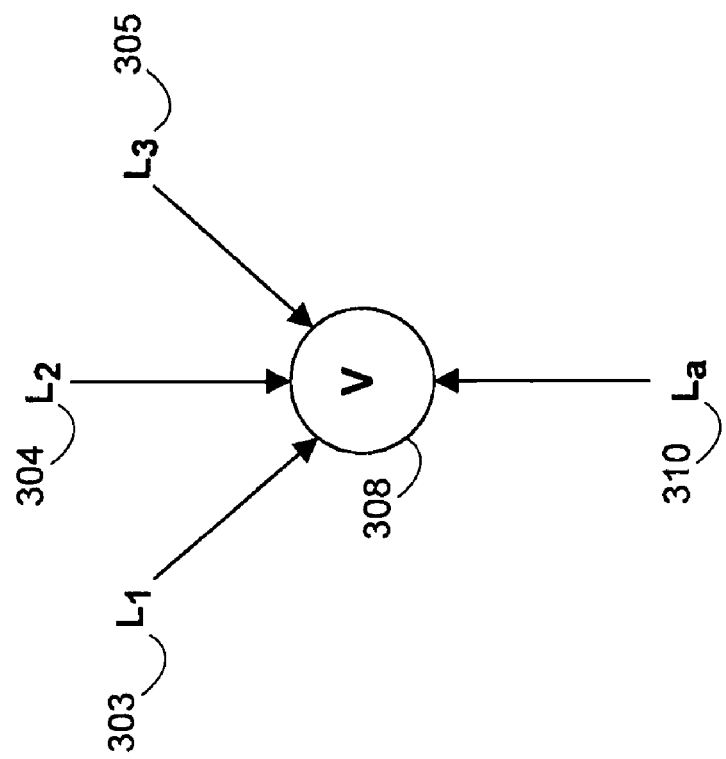
FIG. 3A. shows an enlarged view of a symbol node.

FIG. 3A shows an enlarged view 300A of a symbol node 308, which may be, for example, one of the symbol nodes 206a-206e of FIG. 2. Symbol node 308 represents an ECC-encoded data symbol. The enlarged view 300 also includes extrinsic information 303, 304, and 305 and channel information 310. In various embodiments, extrinsic information 303, 304, and 305 may include any number of extrinsic information, including 1, 2, 3, 4, 5, 6, 7, 8, 10, 12, 15, or more than 15. In various embodiments, channel information 310 may include any number of channel information, including 1, 2, 3, 4, 5, 6, 7, 8, 10, 12, 15, or more than 15. The numbers of extrinsic and channel information may depend on the numeral system used to represent the ECC-encoded data symbol represented by symbol node 308. For example, the numeral system may be binary, ternary, quaternary, or any suitable numeral system.

With reference to FIG. 3A, the extrinsic information 303, 304, and 305 arrives at symbol node 308. The channel information 310 also arrives at symbol node 308. In one embodiment, the extrinsic information 303, 304, and 305 and the channel information 310 include soft information, such as log likelihood ratios (LLRs) and/or probability values. For example, if the ECC-encoded data represented by the symbol node 308 is binary, the extrinsic information 303, 304, and 305 and channel information 310 for the symbol node 308 may be the probability $P(v=1)$ or the probability $P(v=0)$. In another example in which the ECC-encoded data represented by the symbol node 308 is binary, the extrinsic information 303, 304, and 305 and channel information 310 for a symbol node may be the log-likelihood ratio $$\log\left(\frac{P(v=1)}{P(v=0)}\right).$$

According to one implementation, a positive LLR indicates that the ECC-encoded data represented by symbol node 308 is likely to have the value 1, whereas a negative LLR indicates that the ECC-encoded data represented by symbol node 308 is likely to have the value 0.

In one embodiment in which the ECC-encoded data represented by the symbol node 308 is a binary value, the sign of the extrinsic information 303, 304, and 305 and/or of the channel information 310 indicates the value of the ECC-encoded data represented by the symbol node 308 as described above. For example, a positive sign indicates that the value of the symbol node 308 is 1, while a negative sign indicates that the value of the symbol node 308 is zero. In one example, channel information 310 ($L_a$) equals 3, extrinsic information 303 ($L_1$) equals 4, extrinsic information 304 ($L_2$) equals 1, and extrinsic information 305 ($L_3$) equals −2. In this example the channel information 310 ($L_a$) indicates that the ECC-encoded data represented by symbol node 308 is likely to be 1 since the sign of $L_a$ is positive. Additionally, the overall extrinsic information 303, 304 and 305, defined as $L_e=L_1+L_2+L_3$, indicates that the value of the information of symbol node 308 is likely to be 1, since the sign of $L_e$ is positive. Note that in this example, the channel information 308 and the extrinsic information 303, 304, and 305 is represented as log likelihood ratios.

In another example, $L_a=3$, $L_1=-4$, $L_2=1$, and $L_3=-2$. In this case the channel information 310 ($L_a$) indicates that the value of the information of symbol node 308 is likely to be 1 since the sign of $L_a$ is positive. However, the sign of the overall extrinsic information 303, 304, and 305 is negative, indicating that the value of the information of symbol node 308 is likely to be 0. When the overall extrinsic information 303, 304, and 305 and the channel information 310 each indicate conflicting values for the symbol node 308, then an error may have occurred, and the channel information is updated as described in further detail below with respect to FIG. 4.

FIG. 3B shows another enlarged view 300B of the symbol node 308, which may be, for example, one of the symbol nodes 206a-206e of FIG. 2. Symbol node 308 represents an ECC-encoded data symbol. The enlarged view 300 also includes extrinsic information 303, 304, 305, and 306, and channel information 310, 311, 312, and 313. In one example, the ECC-encoded data symbol represented by the symbol node 308 is a quaternary value, and the extrinsic information 303, 304, 305, and 306 and channel information 310, 311, 312, and 313 for the symbol node 308 includes log-likelihood ratios. The extrinsic information 303, 304, 305, and 306 may comprise a first log-likelihood ratio vector having four LLRs, and the channel information 310, 311, 312, and 313 may comprise a second log-likelihood ratio vector having four LLRs. Each log-likelihood ratio vector may have the same structure:

$$L(v) = \left[\log\left(\frac{P(v=0)}{P(v=0)}\right)\right.$$
$$\left.\log\left(\frac{P(v=1)}{P(v=0)}\right) \log\left(\frac{P(v=2)}{P(v=0)}\right) \text{ and } \log\left(\frac{P(v=3)}{P(v=0)}\right)\right]$$

The LLRs in the log-likelihood ratio vector $L(v)$ may correspond to the quaternary values 0, 1, 2, and 3 respectively. Note that the first entry of the log-likelihood ratio vector $L(v)$ is 0. According to one quaternary implementation, the ECC-encoded data represented by symbol node 308 is likely to have the value corresponding to the largest LLR in the log-likelihood ratio vector. For example, if the fourth entry in the log-likelihood ratio vector for a symbol node is largest, the ECC-encoded data represented by that symbol node is likely to be 3. In other embodiments, other non-binary encoding schemes may be used, and log-likelihood ratio vector $L(v)$ may have any number of elements, including, 2, 3, 4, 5, 6, 7, 8, 10, 12, 15, or more than 15.

Figure 4:
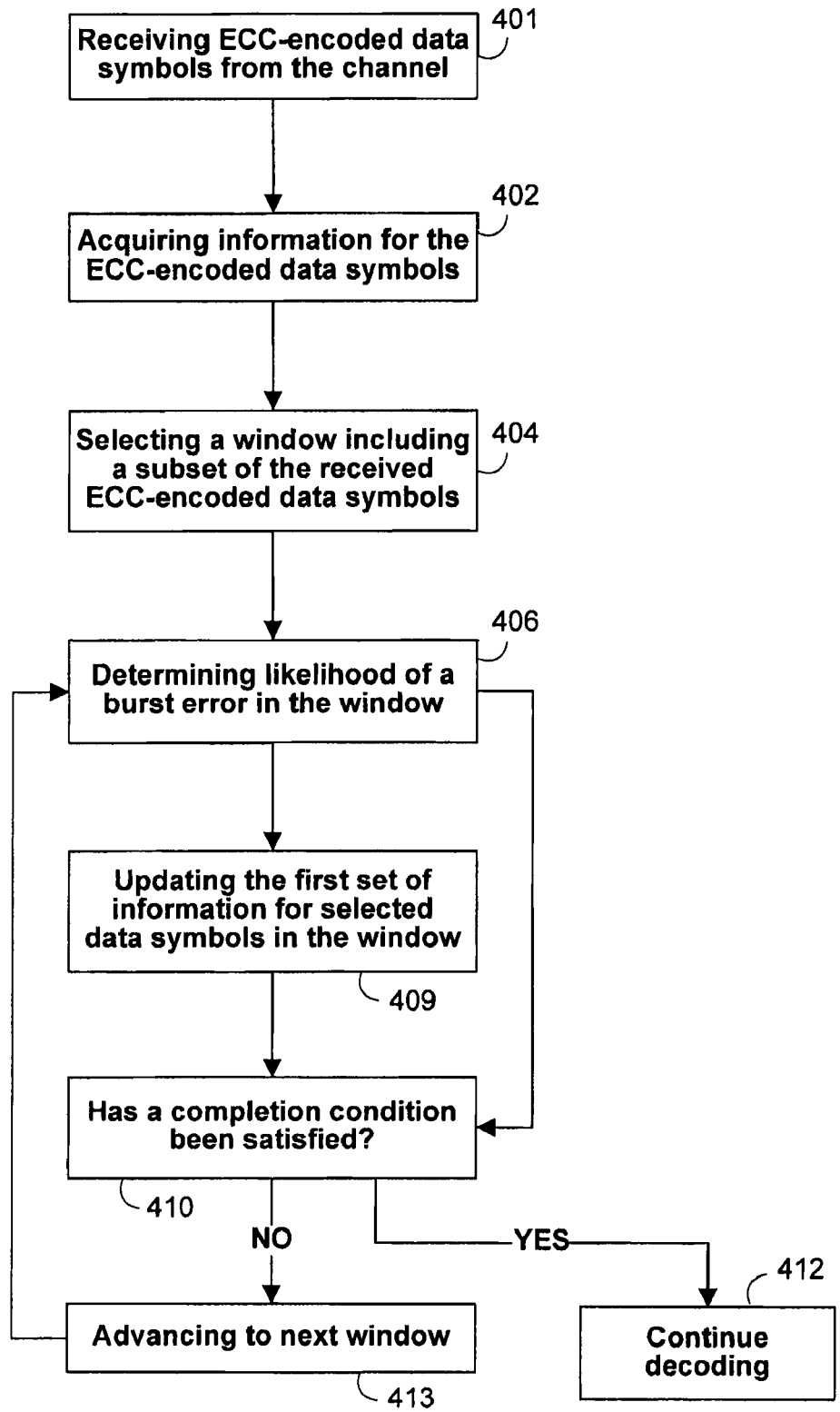
FIG. 4 is a flowchart illustrating a method for iterative decoding in the presence of burst errors.

FIG. 4 is a flowchart illustrating a method 400 for iterative decoding in the presence of burst errors. In block 401 ECC-encoded data symbols are received. In block 402, one iteration of iterative decoding is performed to acquire information for the ECC-encoded data symbols. The information may include a first set of information and a second set of information. The first set of information may include extrinsic information and the second set of information may include channel information. In block 404, a window is selected including a set of consecutive symbol nodes, which are computation units representative of the ECC-encoded data symbols received at block 401. In block 406, the likelihood of a burst error in the window is determined based on soft information incoming to the symbol nodes. The soft information may include the extrinsic information and the channel information, which are substantially the same as the first set of information 204a-204e and the second set of information 208a-208e described in FIG. 2. If it is determined in block 406 that a burst error is likely to have occurred, then, in block 409, the second set of information is updated. The second set of information updated may comprise the channel information. Alternatively, if at block 406 it is determined that a burst error is not likely to have occurred, the method 400 may proceed directly to block 410.

At block 410, the method 400 includes checking whether a completion condition has been satisfied. According to one example, the completion condition includes processing of all of the received ECC-encoded data symbols to determine whether burst errors are likely to have occurred. If a completion condition has not been satisfied, then the method 400 proceeds to block 413, where a different window is selected, and steps 406 and 409 are repeated. Alternatively, if the completion condition has been satisfied, the iterative decoding method 400 may proceed to block 412. At block 412, the decoding process may be continued. In one embodiment, at block 412 the decoding process may be restarted with updated information from the previous iterations of the method 400. In another embodiment, at block 412 the decoding may be stopped. If the iterative decoding is restarted at step 406, the updated information from the previous iterations of the method 400 may be used in further iterations of the method 400. Additionally, in subsequent iterations, the number of symbol nodes included in the window selected at step 413 may remain fixed during subsequent iterations of the method 400, or the number of symbol nodes included in the window may be variable. In one embodiment, the next window is selected by advancing the previous window by a fixed number of symbols. In another embodiment, the next window is selected by moving to a suspicious location where a burst error may have occurred.

In one implementation of the invention, if the completion condition has not been satisfied at block 410, the method 400 terminates. Decoding may be continued at a later time at block 401 if more error correction code-encoded symbols are received. This implementation may occur when no channel information was updated at block 409 over the course of the method 400. In another implementation, the method 400 restarts the decoding by acquiring new channel information at block 402.

As described above, in block 406 the likelihood of a burst error in a selected window is determined based on extrinsic and channel information. The determination of the likelihood of a burst error may rely on "hard decisions" obtained from both the extrinsic information and the channel information. A "hard decision" is a determination of the most likely value for a piece of information. As described above, if it is determined that a burst error is likely to have occurred in the window, channel information for selected data symbols in the window is updated at block 409. This update may include erasing the channel information within the window.

Figure 5A:
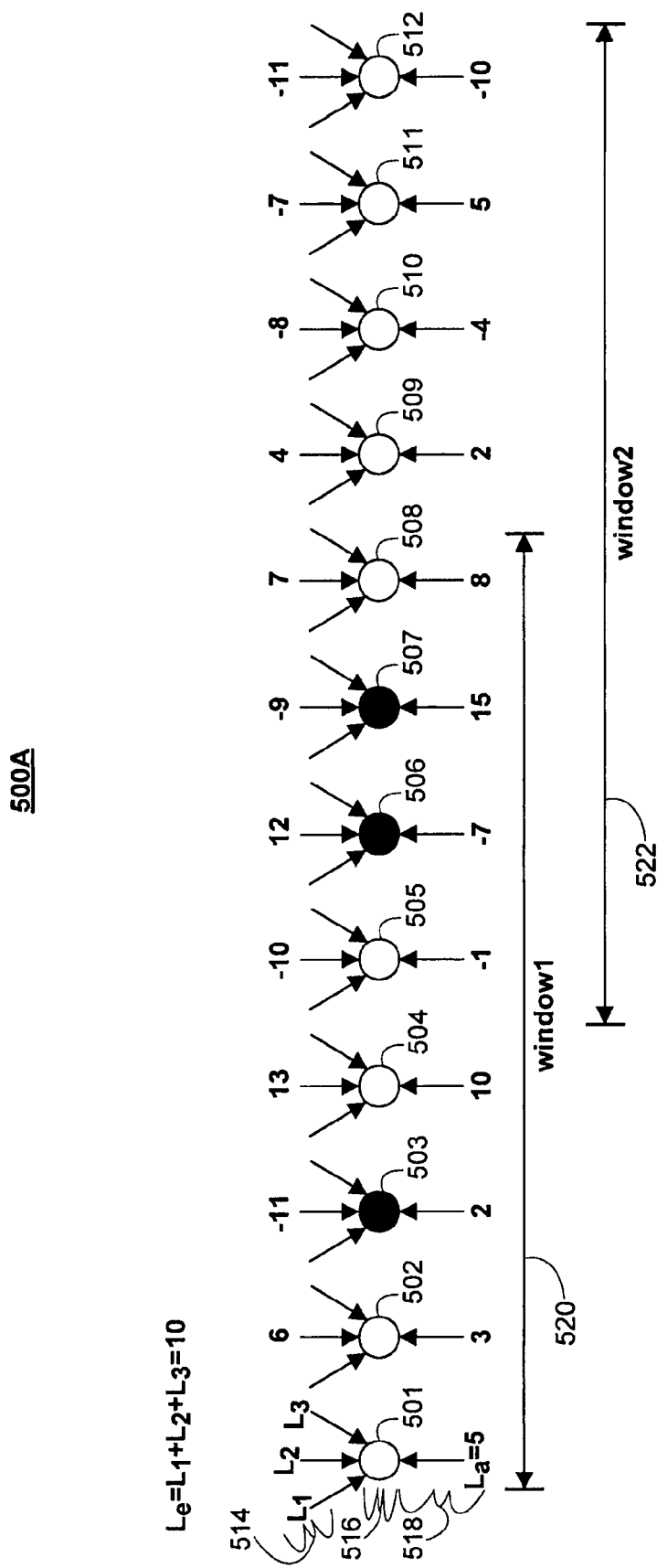
FIG. 5A depicts a block diagram illustrating an exemplary set of symbols nodes, according to one embodiment of the invention.

FIG. 5A depicts a block diagram 500A illustrating an exemplary set of symbols nodes 516, channel information 518, and extrinsic information 514, according to one embodiment of the invention. The channel information 514 and the extrinsic information 518 may be substantially the same as the first set of information 204a-204e and the second set of information 208a-208e described with respect to FIG. 2. Each symbol node of the set of symbols nodes 516 represents a data symbol and has value corresponding to the data symbol. Also shown in FIG. 5A are first window 520 and second window 522, each including a subset of the symbol nodes 516. According to one embodiment, FIG. 5A is an exemplary implementation of the method 400 described with respect to FIG. 4.

The first window 520 includes eight symbols nodes 501, 502, 503, 504, 505, 506, 507, and 508. Each of the symbols nodes 501, 502, 503, 504, 505, 506, 507, and 508 has a value, and in some embodiments the value associated with one or more of the symbol nodes 501, 502, 503, 504, 505, 506, 507, and 508 may be incorrect. If a symbol node 501, 502, 503, 504, 505, 506, 507, or 508 has an incorrect value, there is an error in the value of the symbol node. If more than a predetermined number of the symbol nodes 501, 502, 503, 504, 505, 506, 507, and 508 includes an error, then a "burst error" has occurred in the first window 520. In various embodiments, the predetermined number may be a 2, 3, 4, 5, 6, 7, 8, 10, 12, 15, or more than 15. In some embodiments, the predetermined number may be a selected fraction of the symbol nodes included in the selected window.

In determining whether a burst error is likely to have occurred in the first window 520, hard decisions are obtained using the extrinsic information 514 and the channel information 518 for each symbol node 501, 502, 503, 504, 505, 506, 507, and 508 within the first window 520. The channel information 518 is represented as LLRs (hereinafter "channel LLR"), and the extrinsic information 514 is represented as the sum of the total incoming extrinsic LLRs for each symbol node (hereinafter referred to as a "extrinsic summed LLR"). For example, the extrinsic information for symbol node 501 is extrinsic summed LLR $L_e=L_1+L_2+L_3=10$. The hard decision for the extrinsic summed LLR is determined from the sign of the extrinsic summed LLR for each symbol node, as explained above with respect to FIG. 3. Similarly, the hard decision for the channel LLR is determined from the sign of the channel LLR for each symbol node. According to one example, a negative channel LLR or extrinsic summed LLR indicates that the value of the symbol node is likely to be 0, while a positive channel LLR or extrinsic summed LLR indicates that the value of the symbol node is likely to be 1. Hard decisions for the extrinsic summed LLR and the channel LLR are determined for each symbol node in the first window 520.

With the hard decision from the extrinsic information 514 and the hard decision from the channel information 518 determined for each symbol node 501, 502, 503, 504, 505, 506, 507, and 508 in the first window 520, a subset of the symbol nodes 501, 502, 503, 504, 505, 506, 507, and 508 in the first window 520 preferably is selected such that for each symbol node of the selected subset, the hard decision for the extrinsic information 514 is different from the hard decision for the channel information 518. As shown in FIG. 5A, the subset of symbols nodes 501, 502, 503, 504, 505, 506, 507, and 508 for which this condition holds includes the shaded symbol nodes 503, 506, and 507. For symbol node 503, the extrinsic information has a negative value of −11, and thus the hard decision indicates "negative" while the channel information has a positive value of 2, and thus the hard decision indicates "positive". For symbol node 506, the extrinsic information has a positive value of 12, and thus the hard decision indicates "positive" while the channel information has a negative value of −7, and thus the hard decision indicates "negative". For symbol node 507, the extrinsic information has a negative value of −9, and thus the hard decision indicates "negative" while the channel information has a positive value of 15, and thus the hard decision indicates "positive". Thus, for symbol nodes 503, 506, and 507, the hard decision for the extrinsic information is different from the hard decision for the channel information, and it is determined that the values for the symbol nodes 503, 506, and 507 are likely to include an error. Therefore, symbol nodes 503, 506, and 507 are included in the selected subset in which the hard decision for the extrinsic information 514 is different from the hard decision for the channel information 518. Note that for each of the remaining symbol nodes 501, 502, 504, 505, and 508, the hard decisions obtained from the extrinsic summed LLRs are the same as the hard decisions obtained from the channel LLRs.

From the selected subset of symbol nodes 503, 506, and 507, the likelihood of a burst error in the first window 520 is determined based on one or more conditions. One condition includes determining whether the total size of the selected subset exceeds a predetermined threshold value, where the size is the number of symbol nodes in the selected subset. According to some embodiments, if the size of the selected subset is large, there are potentially many errors in the window, and a burst error is likely to have occurred. Another condition for determining the likelihood of a burst error includes determining whether the sum of the absolute value of the extrinsic summed LLRs for symbol nodes 503, 506, and 507 in the selected subset exceeds a predetermined threshold value. As shown in FIG. 5A, the sum of the extrinsic summed LLRs for symbol nodes 503, 506, and 507 is: |−11|+|12|+|−9|=32. Thus, if for example the predetermined threshold value equals 30, the sum (which equals 32) exceeds the threshold, and a burst error is likely to have occurred in the first window 520.

According to one embodiment, when a burst error is likely to have occurred in the first window 520, the channel information 518 associated with the symbol nodes 501, 502, 503, 504, 505, 506, 507, and 508 in the first window 520 is updated. Updating may include erasing the channel information 518 for each symbol node 501, 502, 503, 504, 505, 506, 507, and 508 in the first window 520. Alternatively, updating may include erasing the channel information for each symbol node 503, 506, and 507 in the selected subset of symbol nodes in the first window 520 for which the hard decision obtained from the extrinsic summed LLR is different from the hard decision obtained from the channel LLR.

Figure 5B:
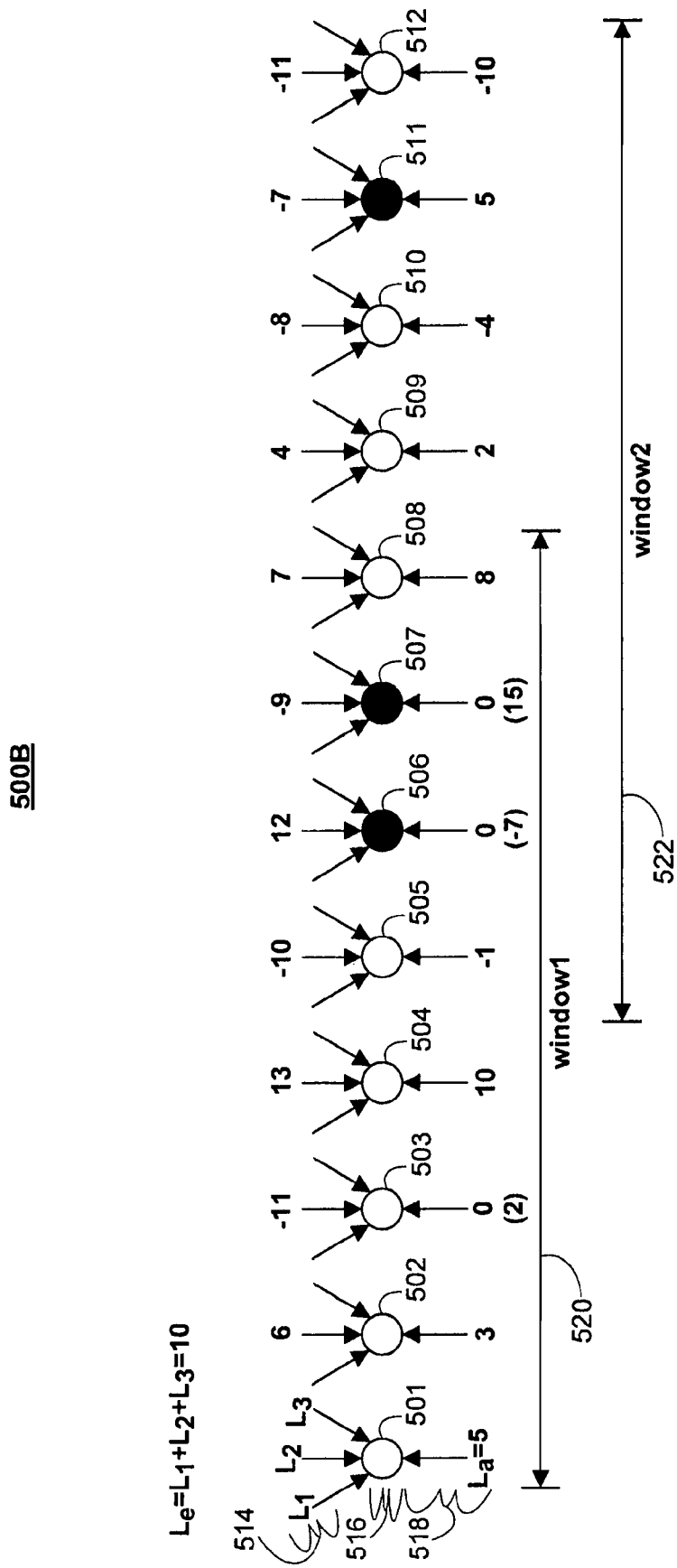
FIG. 5B depicts a block diagram illustrating an exemplary set of symbols nodes according to one embodiment of the invention.

FIG. 5B depicts a block diagram 500B illustrating substantially the same components as block diagram 500A of FIG. 5A. According to the illustrative embodiment, the channel LLR for symbol nodes 503, 506, and 507 has been erased, and replaced with the value zero. A channel LLR value of zero provides no information as to whether the ECC-encoded data symbols represented by the symbol nodes 503, 506, and 507 is binary 1 or 0. Additionally, the previous channel information is preserved for symbol nodes 503, 506, and 507, as shown in parentheses under the current channel LLR values of zero. The previous channel information is used again in determining whether a burst error occurs in the second window 522.

According to one embodiment, after the channel information for symbol nodes 503, 506, and 507 is updated, the first window 520 is advanced four symbol nodes and becomes the second window 522. The second window includes the symbol nodes 505, 506, 507, 508, 509, 510, 511, and 512. A new subset of symbol nodes for which the hard decisions from the extrinsic summed LLRs is different from the hard decisions from the channel LLRs is selected from the second window 522. As shown in FIG. 5B, the new selected subset includes shaded symbols 506, 507, and 511. Note that the subset is selected based on the previous channel LLRs before updating the channel information for symbol nodes in the first window 520, as described above with respect to FIG. 5A. Note that the symbol nodes 505, 508, 509, 510, and 512 are not included in the selected subset, because the hard decisions obtained from the extrinsic summed LLRs are not different from the hard decisions obtained from the channel LLRs for these symbols. As described above with respect to FIG. 5A, one or more conditions are applied to the symbol nodes 506, 507, and 511 of the selected subset in the second window 522 to determine if a burst error is likely to have occurred. According to the illustrative example, the condition includes determining whether the sum of the extrinsic summed LLRs for symbol nodes 506, 507, and 511 exceeds a predetermined threshold value. The sum of the absolute values of the extrinsic summed LLRs for symbol nodes 506, 507, and 511 is: |12|+|−9|+|−7|=28. Thus, if the predetermined threshold value equals 30, then, since 28 is less than 30, it is determined that a burst error is not likely to have occurred in the second window 522. Since a burst error is not likely to have occurred, no channel information 518 is updated in the second window 522.

Figure 5C:
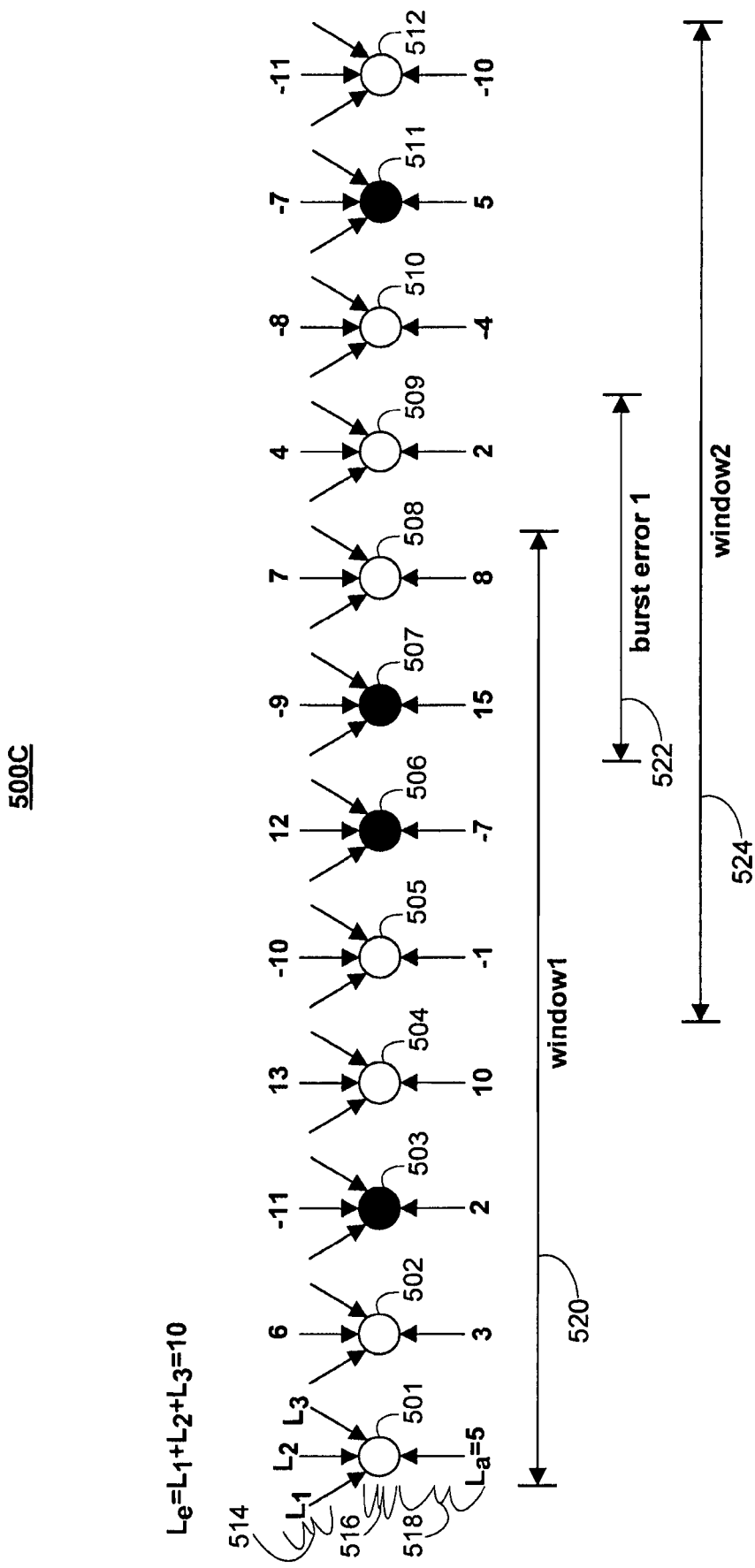
FIG. 5C. depicts a block diagram illustrating an exemplary set of symbols nodes according to one embodiment of the invention.

FIG. 5C. depicts a block diagram 500C illustrating substantially the same components as FIG. 5A. FIG. 5C additionally includes a "burst error window" 524. The burst error window 524 identifies a subset of consecutive symbol nodes in which burst error detection circuitry has detected a burst error. Burst error detection circuitry may be used in addition to the components implementing the method 400 of FIG. 4 to detect additional subsets of symbol nodes 516 in which a burst error is likely to have occurred.

According to one embodiment, the burst error window 524 improves detection of burst errors in the symbol nodes 516. When the burst error detection circuitry detects a burst error in a selected window of the symbol nodes 516, the predetermined threshold for determining whether a burst error is likely to have occurred in the selected window (as described in FIGS. 5A and 5B) is adjusted. The adjusting may include increasing or decreasing the predetermined threshold for determining whether a burst error is likely to have occurred in the selected window. For example, as shown in FIG. 5C, the burst error window 524, including symbol nodes 507, 508, and 509, overlaps with the second window 522. Because the burst error detection circuitry detected a burst error in the second window 522, the predetermined threshold for the minimum value of the sum of the extrinsic summed LLRs for the shaded symbol nodes 506, 507, and 511 is decreased. In the example of FIG. 5B, the predetermined threshold was set at 30, and because the sum of the extrinsic summed LLRs for the shaded symbols 506, 507, and 511 equals 28, it was determined that no burst error occurred in the second window 522. In the current example of FIG. 5C, however, the burst error window 524 overlaps with the second window 522, and the predetermined threshold is decreased. If the predetermined threshold is decreased to 25, then the sum of the extrinsic summed LLRs for the shaded symbols 506, 507, and 511 (which equals 28) exceeds the predetermined threshold, and a burst error is determined to have occurred in the second window 522.

In some implementations, the predetermined threshold may not be adjusted unless the burst error window 524 overlaps with the selected window by a minimum number of symbol nodes 516. In one example, the predetermined threshold will be adjusted if the burst error window 524 overlaps with the selected window by at least three symbol nodes 516. In this example, the predetermined threshold for the second window 522 is adjusted, since the burst error window 524 and the second window 522 overlap by three symbol nodes 507, 508, and 509. However, the predetermined threshold for the first window 520 is not adjusted, since the burst error window 524 and the first window 520 overlap by only two symbol nodes 507 and 509.

Figure 5D:
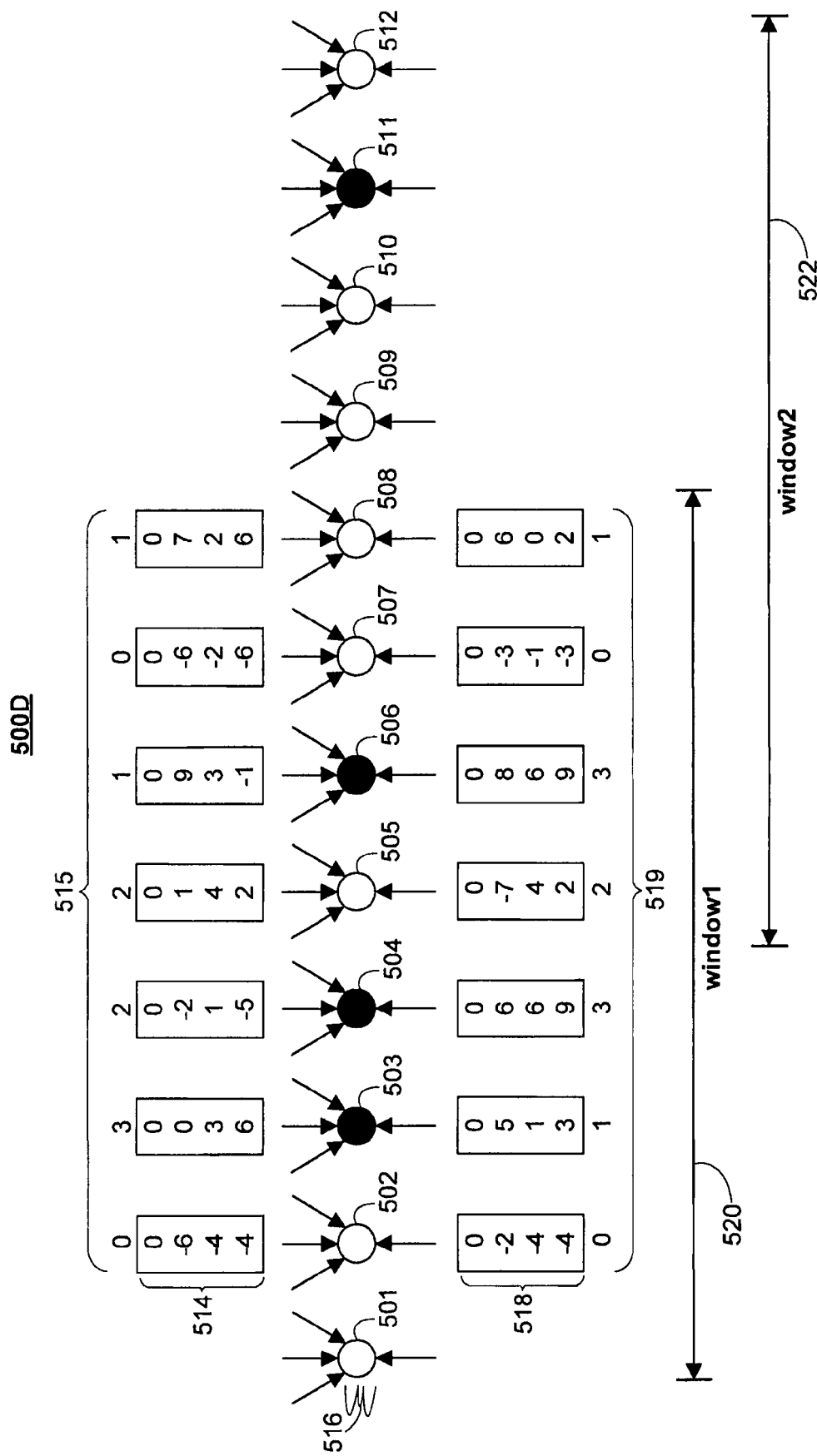
FIG. 5D. depicts a block diagram illustrating an exemplary set of symbols nodes according to one embodiment of the invention.

FIG. 5D. depicts a block diagram 500D illustrating substantially the same components as FIG. 5A. However, the ECC-encoded data symbols represented by the symbol nodes 501, 502, 503, 504, 505, 506, 507, 508, 510, 511, and 512 are quaternary values—e.g. the quaternary values 0, 1, 2, and 3. Symbol nodes 501, 502, 503, 504, 505, 506, 507, 508, 510, 511, and 512 are substantially similar to symbol node 308 depicted in FIG. 3B. The extrinsic information 514 may comprise a first log-likelihood ratio vector including four LLRs, and the channel information 518 may comprise a second log-likelihood ratio vector including four LLRs. The log-likelihood ratio vectors may be substantially similar to the log-likelihood ratio vector described with respect to FIG. 3B. For example, the uppermost piece of extrinsic information 514 may correspond to the value $$\log\left(\frac{P(v=0)}{P(v=0)}\right)$$

for the quaternary value 0, the second uppermost piece of extrinsic information 514 may correspond to the value $$\log\left(\frac{P(v=1)}{P(v=0)}\right)$$

for the quaternary value 1, the third uppermost piece of extrinsic information 514 may correspond to the value $$\log\left(\frac{P(v=2)}{P(v=0)}\right)$$

for the quaternary value 2, and the lowest piece of extrinsic information 514 may correspond to the value $$\log\left(\frac{P(v=3)}{P(v=0)}\right)$$

for the quaternary value 3. Additionally, the uppermost piece of channel information 518 may correspond to the value $$\log\left(\frac{P(v=0)}{P(v=0)}\right)$$

for the quaternary value 0, the second uppermost piece of channel information 518 may correspond to the value $$\log\left(\frac{P(v=1)}{P(v=0)}\right)$$

for the quaternary value 1, the third uppermost piece of channel information 518 may correspond to the value $$\log\left(\frac{P(v=2)}{P(v=0)}\right)$$

for the quaternary value 2, and the lowest piece of channel information 518 may correspond to the value $$\log\left(\frac{P(v=3)}{P(v=0)}\right)$$

for the quaternary value 3. Note that the entry of the log-likelihood ratio $$\log\left(\frac{P(v=0)}{P(v=0)}\right)$$

is always 0.

According to some implementations, the ECC-encoded data represented by a particular symbol node is likely to have the value corresponding to the largest LLR in each log-likelihood ratio vector. For example, because the fourth entry in the log-likelihood ratio vector for the extrinsic information 514 of symbol node 503 is largest, the ECC-encoded data represented by that symbol node is likely to be 3. This is represented by the extrinsic hard decision information 515. In another example, because the second entry in the log-likelihood ratio vector for the channel information 518 of symbol node 503 is largest, the ECC-encoded data represented by the symbol node is likely to be 1. This is represented by the channel hard decision information 519. In other embodiments other non-binary encoding schemes may be used, and log-likelihood ratio vectors representing the extrinsic information 514 and the channel information 518 may have any number of elements, including, 2, 3, 4, 5, 6, 7, 8, 10, 12, 15, or more than 15.

According to one embodiment, the most likely symbol value for each symbol node 516 may be determined based on the extrinsic information 514 and the channel information 518. This determination may occur similar to that described above with respect to symbol node 503. In addition, the second most likely symbol value for each symbol node 516 corresponding to the extrinsic information 514 may be determined based on the extrinsic information 514. For example, the second most likely symbol value for each symbol node 516 corresponding to the extrinsic information 514 based on the extrinsic information 514 may be the second highest value of extrinsic information 514 for a particular symbol node 516. In the case that there are two values of extrinsic information 514 that are equal and are the highest or second highest in value, the most likely value may be determined on a random basis. In addition, because the hard decision information 515 for the extrinsic information 514 is different from the hard decision information 519 for the channel information 518 for symbol nodes 503, 504, and 506, these symbol nodes may be selected to be in a selected subset similar to the subset described with respect to FIG. 5A.

The sum of the differences between the extrinsic information 514 corresponding to the most likely symbol value based on the extrinsic information 514 and the extrinsic information 514 corresponding to the second most likely symbol value based on the extrinsic information 514 may be calculated. For example, the extrinsic information 514 corresponding to the most likely symbol value based on the extrinsic information 514 for symbol node 503 is 6, and the extrinsic information 514 corresponding to the second most likely symbol value based on the extrinsic information 514 for symbol node 503 is 3. The extrinsic information 514 corresponding to the most likely symbol value based on the extrinsic information 514 for symbol node 504 is 1, and the extrinsic information 514 corresponding to the second most likely symbol value based on the extrinsic information 514 for symbol node 504 is 0. The extrinsic information 514 corresponding to the most likely symbol value based on the extrinsic information 514 for symbol node 506 is 9, and the extrinsic information 514 corresponding to the second most likely symbol value based on the extrinsic information 514 for symbol node 506 is 3. The sum of the differences between this data is calculated as (6−3)+(1−0)+(9−3)=10. From the selected subset of symbol nodes 503, 504, and 506, the likelihood of a burst error in the first window 520 may be determined based on one or more conditions. The condition may include exceeding a predetermined threshold for the sum of differences. For example, if the predetermined threshold is 8, it may be determined that a burst error occurred in first window 520. In certain embodiments, the predetermined threshold may be adjusted as described with respect to FIG. 5C.

According to another embodiment, the most likely symbol value for each symbol node 516 may be determined based on the extrinsic information 514 and the channel information 518. The most likely symbol value corresponding to the extrinsic information 514 for each data symbol based on the extrinsic information 514 may be determined based on the extrinsic information 514 similar to the process described above. In addition, the most likely symbol value for each symbol node 516 corresponding to the extrinsic information 514 may be determined based on the channel information 518. For example, the most likely symbol value for each symbol node 516 based on the channel information 518 may be the highest value of channel information 518 for a particular symbol node. The extrinsic information 514 corresponding to that channel information 518 may be the extrinsic information 514 in the log-likelihood vector with the same index as the most likely symbol value based on the channel information 518. In the case that there are two values of extrinsic information 514 and/or channel information 518 that are equal and are the highest in value, the most likely value may be determined on a random basis. In addition, because the hard decision information 515 for the extrinsic information 514 is different from the hard decision information 519 for the channel information 518 for symbol nodes 503, 504, and 506, these symbol nodes may be selected to be in a selected subset similar to the subset described with respect to FIG. 5A.

The sum of the differences between the extrinsic information 514 corresponding to the most likely symbol value based on the extrinsic information 514 and the extrinsic information 514 corresponding to the most likely symbol value based on the channel information 518 may be calculated. For example, the extrinsic information 514 corresponding to the most likely symbol value based on the extrinsic information 514 for symbol node 503 is 6, and the extrinsic information 514 corresponding to the most likely symbol value based on the channel information 518 for symbol node 503 is 0. The extrinsic information 514 corresponding to the most likely symbol value based on the extrinsic information 514 for symbol node 504 is 1, and the extrinsic information 514 corresponding to the most likely symbol value based on the channel information 518 for symbol node 504 is −5. The extrinsic information 514 corresponding to the most likely symbol value based on the extrinsic information 514 for symbol node 506 is 9, and the extrinsic information 514 corresponding to the most likely symbol value based on the channel information 518 for symbol node 506 is −1. The sum of the differences between this data is calculated as (6−0)+(1−(−5))+(9−(−1))=22. From the selected subset of symbol nodes 503, 504, and 506, the likelihood of a burst error in the first window 520 may be determined based on one or more conditions. The condition may include exceeding a predetermined threshold for the sum of differences. For example, if the predetermined threshold is 20, it may be determined that a burst error occurred in first window 520. In certain embodiments, the predetermined threshold may be adjusted as described with respect to FIG. 5C.

According to one embodiment, burst error detection circuitry is circuitry monitoring a magnetic recording medium. The burst error detection circuitry may detect the burst errors by detecting, for example, a change in readback signal amplitude caused by a defect in the magnetic recording medium. The circuitry monitoring such a magnetic recording medium could detect this change in readback signal amplitude, and thus aid the systems and methods described in FIGS. 1-5B in determining whether a burst error is likely to occur.

Referring now to FIGS. 6A-6G, various exemplary implementations of the present invention are shown.

Figure 6A:
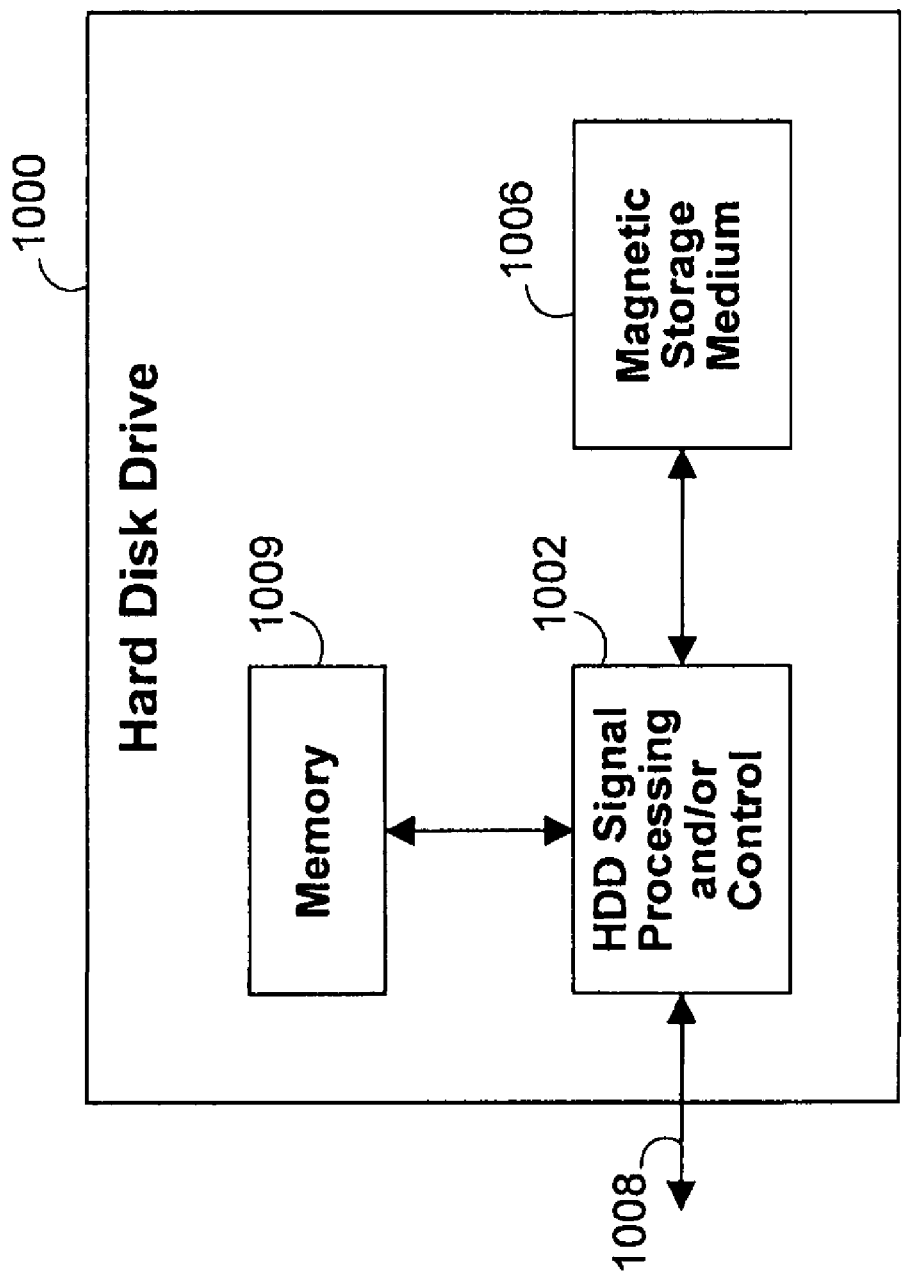
FIG. 6A is a block diagram of an exemplary hard disk drive that can employ the disclosed technology.

Referring now to FIG. 6A, the present invention can be implemented in a hard disk drive 1100. The present invention may implement either or both signal processing and/or control circuits, which are generally identified in FIG. 6A at 1102. In some implementations, the signal processing and/or control circuit 1102 and/or other circuits (not shown) in the HDD 1100 may process data, perform coding and/or encryption, perform calculations, and/or format data that is output to and/or received from a magnetic storage medium 1106.

The HDD 1100 may communicate with a host device (not shown) such as a computer, mobile computing devices such as personal digital assistants, cellular phones, media or MP3 players and the like, and/or other devices via one or more wired or wireless communication links 1108. The HDD 1100 may be connected to memory 1109 such as random access memory (RAM), low latency nonvolatile memory such as flash memory, read only memory (ROM) and/or other suitable electronic data storage.

Figure 6B:
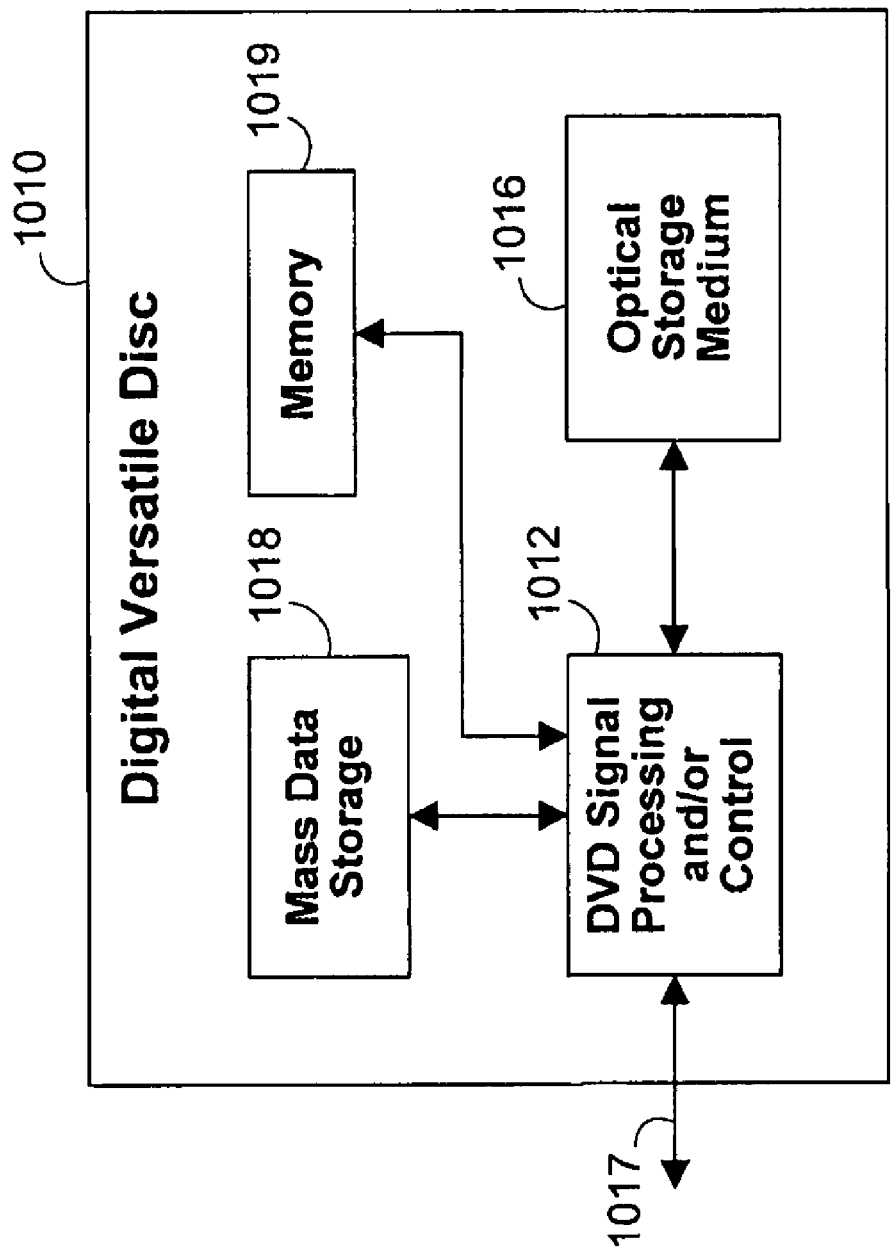
FIG. 6B is a block diagram of an exemplary digital versatile disc that can employ the disclosed technology.

Referring now to FIG. 6B, the present invention can be implemented in a digital versatile disc (DVD) drive 1110. The present invention may implement either or both signal processing and/or control circuits, which are generally identified in FIG. 6B at 1112, and/or mass data storage of the DVD drive 1110. The signal processing and/or control circuit 1112 and/or other circuits (not shown) in the DVD 1110 may process data, perform coding and/or encryption, perform calculations, and/or format data that is read from and/or data written to an optical storage medium 1116. In some implementations, the signal processing and/or control circuit 1112 and/or other circuits (not shown) in the DVD 1110 can also perform other functions such as encoding and/or decoding and/or any other signal processing functions associated with a DVD drive.

The DVD drive 1110 may communicate with an output device (not shown) such as a computer, television or other device via one or more wired or wireless communication links 1117. The DVD 1110 may communicate with mass data storage 1118 that stores data in a nonvolatile manner. The mass data storage 1118 may include a hard disk drive (HDD). The HDD may have the configuration shown in FIG. 6A. The HDD may be a mini HDD that includes one or more platters having a diameter that is smaller than approximately 1.8". The DVD 1110 may be connected to memory 1119 such as RAM, ROM, low latency nonvolatile memory such as flash memory and/or other suitable electronic data storage.

Figure 6C:
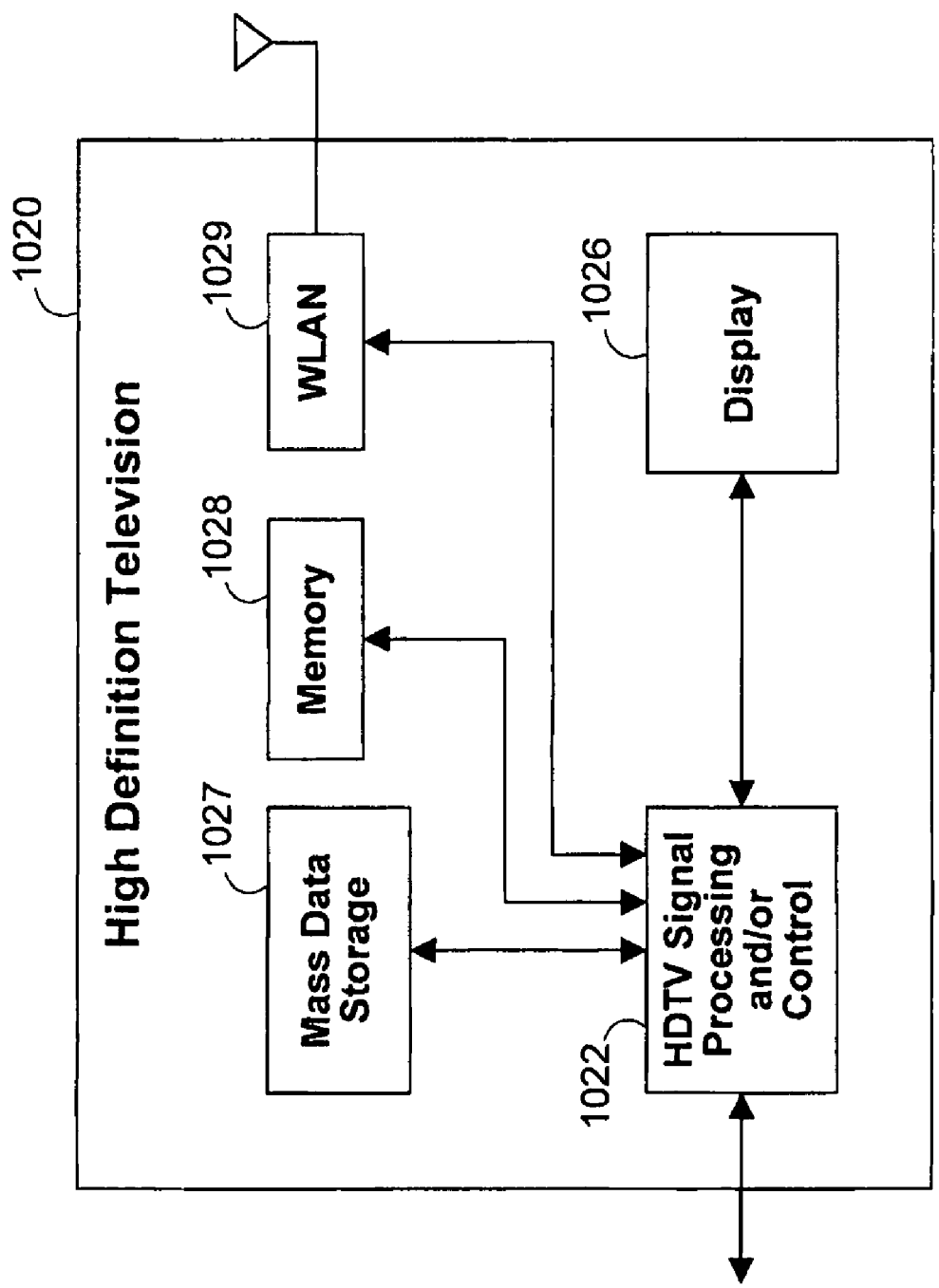
FIG. 6C is a block diagram of an exemplary high definition television that can employ the disclosed technology.

Referring now to FIG. 6C, the present invention can be implemented in a high definition television (HDTV) 1120. The present invention may implement either or both signal processing and/or control circuits, which are generally identified in FIG. 6C at 1122, a WLAN interface and/or mass data storage of the HDTV 1120. The HDTV 1120 receives HDTV input signals in either a wired or wireless format and generates HDTV output signals for a display 1026. In some implementations, signal processing circuit and/or control circuit 1122 and/or other circuits (not shown) of the HDTV 1120 may process data, perform coding and/or encryption, perform calculations, format data and/or perform any other type of HDTV processing that may be required.

The HDTV 1120 may communicate with mass data storage 1127 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 1120 may be connected to memory 1128 such as RAM, ROM, low latency nonvolatile memory such as flash memory and/or other suitable electronic data storage. The HDTV 1120 also may support connections with a WLAN via a WLAN network interface 1029.

Figure 6D:
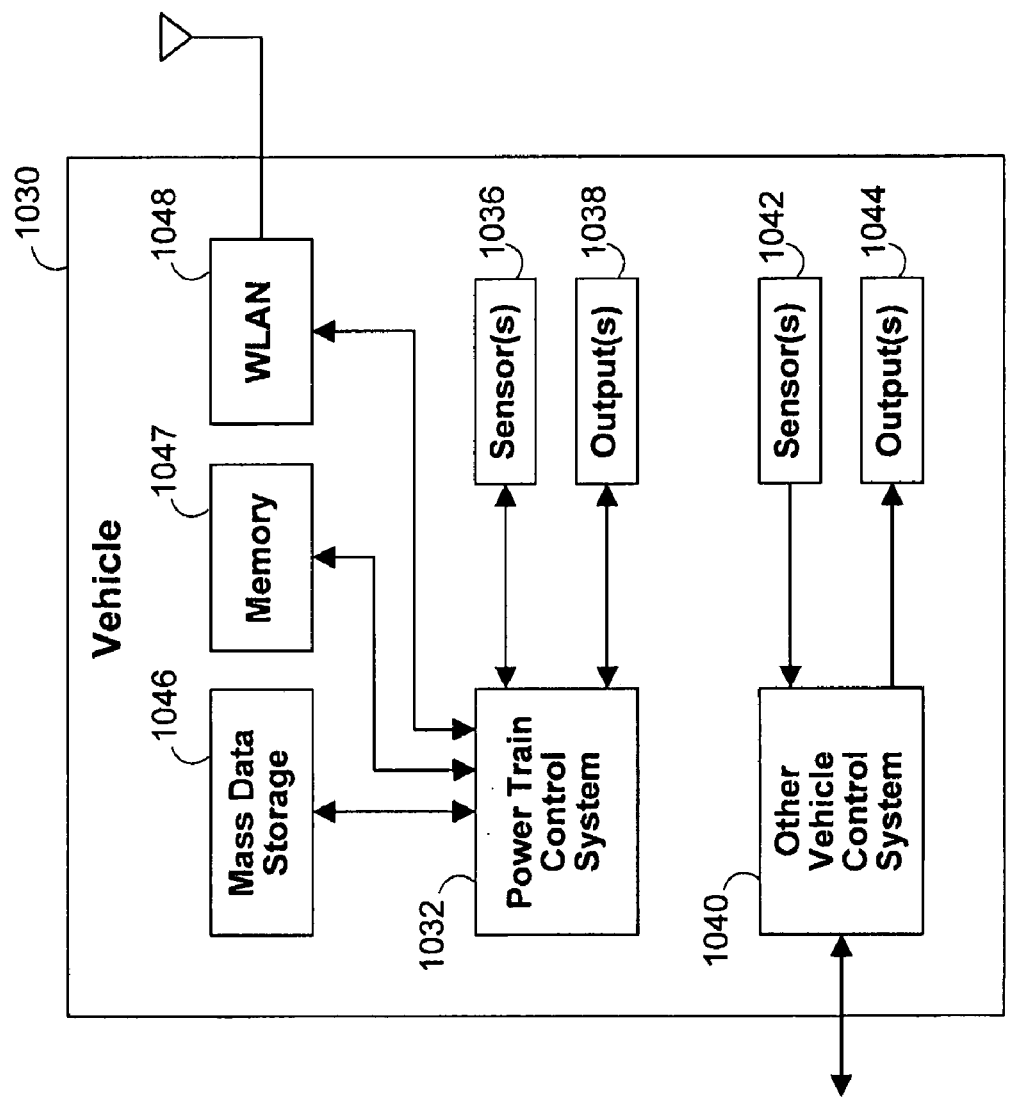
FIG. 6D is a block diagram of an exemplary vehicle that can employ the disclosed technology.

Referring now to FIG. 6D, the present invention implements a control system of a vehicle 1130, a WLAN interface and/or mass data storage of the vehicle control system. In some implementations, the present invention may implement a powertrain control system 1132 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1140 of the vehicle 1130. The control system 1140 may likewise receive signals from input sensors 1142 and/or output control signals to one or more output devices 1144. In some implementations, the control system 1140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1132 may communicate with mass data storage 1146 that stores data in a nonvolatile manner. The mass data storage 1146 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 1032 may be connected to memory 1147 such as RAM, ROM, low latency nonvolatile memory such as flash memory and/or other suitable electronic data storage. The powertrain control system 1032 also may support connections with a WLAN via a WLAN network interface 1148. The control system 1140 may also include mass data storage, memory and/or a WLAN interface (all not shown).

Figure 6E:
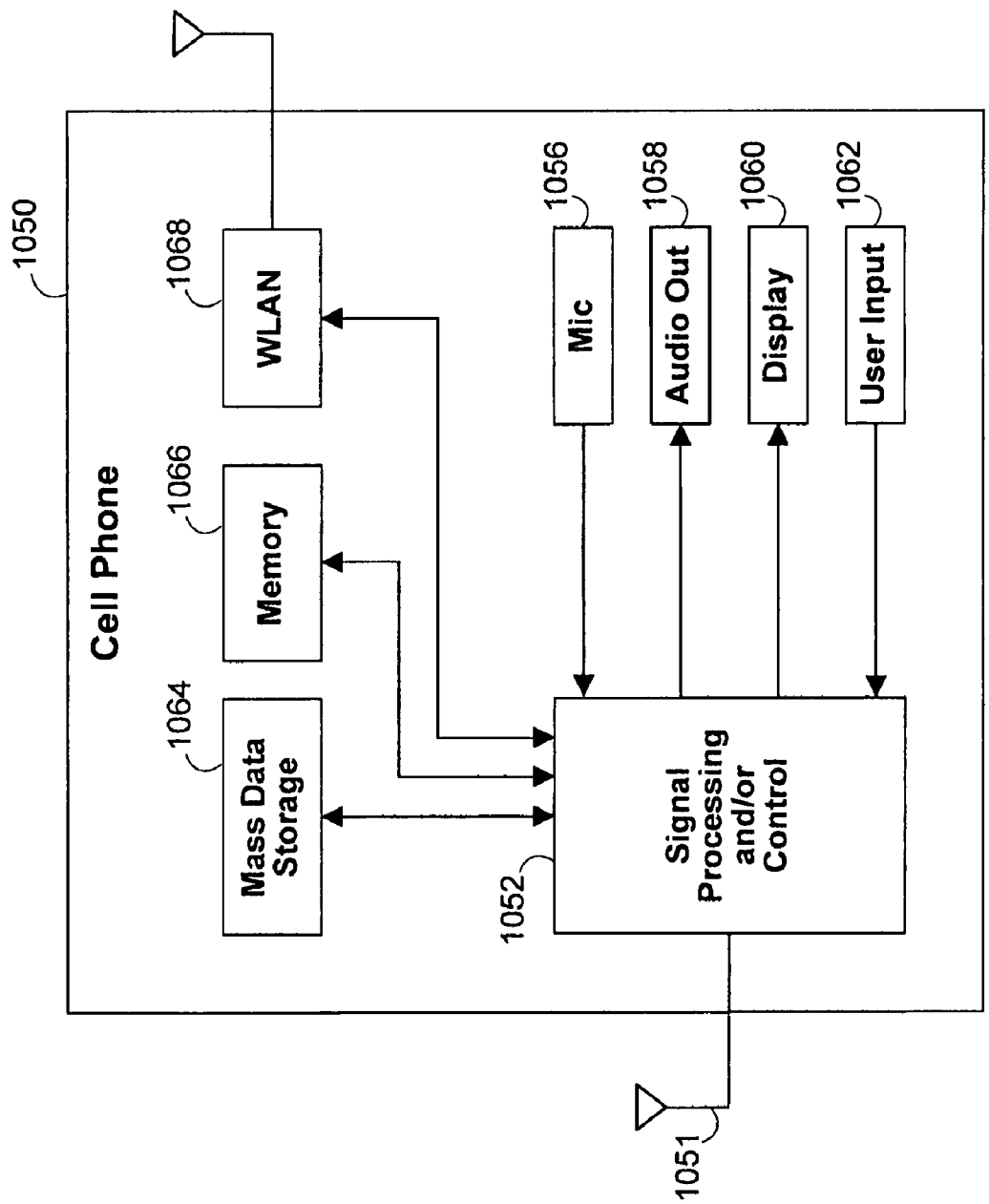
FIG. 6E is a block diagram of an exemplary cell phone that can employ the disclosed technology.

Referring now to FIG. 6E, the present invention can be implemented in a cellular phone 1150 that may include a cellular antenna 1151. The present invention may implement either or both signal processing and/or control circuits, which are generally identified in FIG. 6E at 1152, a WLAN interface and/or mass data storage of the cellular phone 1150. In some implementations, the cellular phone 1150 includes a microphone 1156, an audio output 1158 such as a speaker and/or audio output jack, a display 1160 and/or an input device 1162 such as a keypad, pointing device, voice actuation and/or other input device. The signal processing and/or control circuits 1152 and/or other circuits (not shown) in the cellular phone 1150 may process data, perform coding and/or encryption, perform calculations, format data and/or perform other cellular phone functions.

The cellular phone 1150 may communicate with mass data storage 1164 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 1050 may be connected to memory 1166 such as RAM, ROM, low latency nonvolatile memory such as flash memory and/or other suitable electronic data storage. The cellular phone 1150 also may support connections with a WLAN via a WLAN network interface 1068.

Figure 6F:
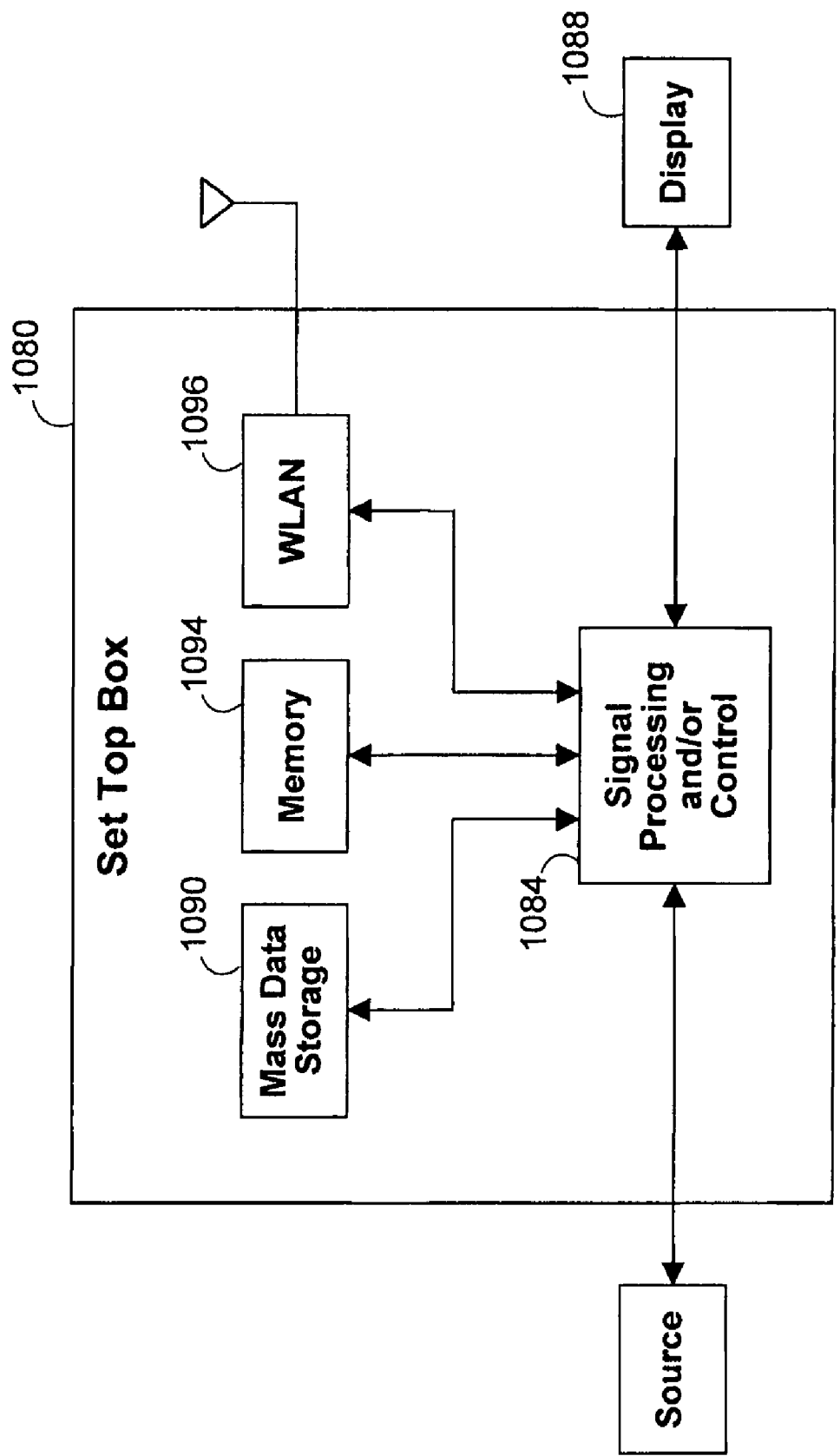
FIG. 6F is a block diagram of an exemplary set top box that can employ the disclosed technology.

Referring now to FIG. 6F, the present invention can be implemented in a set top box 1180. The present invention may implement either or both signal processing and/or control circuits, which are generally identified in FIG. 6F at 1184, a WLAN interface and/or mass data storage of the set top box 1180. The set top box 1180 receives signals from a source such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

The set top box 1180 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 1180 may be connected to memory 1194 such as RAM, ROM, low latency nonvolatile memory such as flash memory and/or other suitable electronic data storage. The set top box 1180 also may support connections with a WLAN via a WLAN network interface 1196.

Figure 6G:
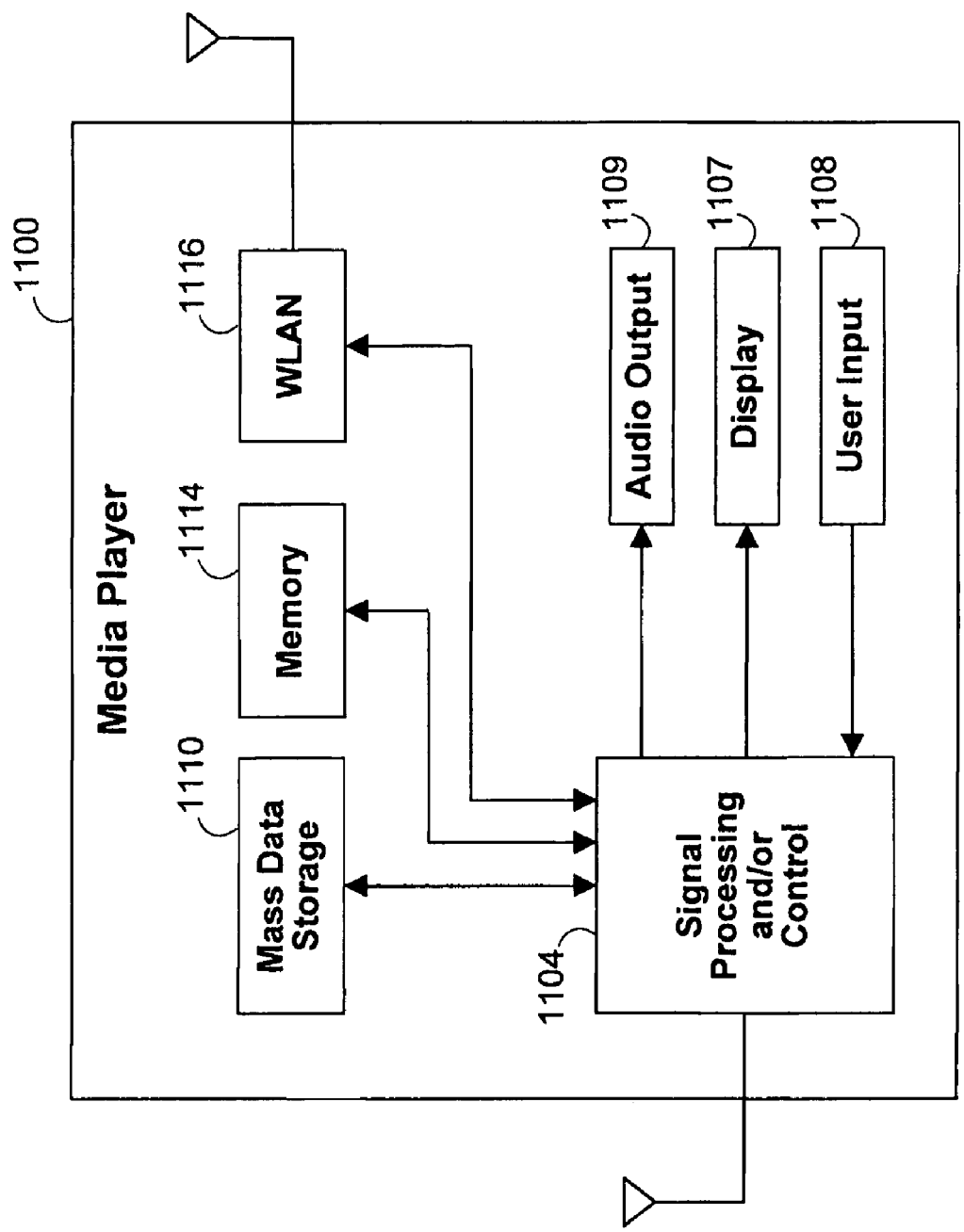
FIG. 6G is a block diagram of an exemplary media player that can employ the disclosed technology.

Referring now to FIG. 6G, the present invention can be implemented in a media player 1200. The present invention may implement either or both signal processing and/or control circuits, which are generally identified in FIG. 6G at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. The media player 1200 further includes an audio output 1209 such as a speaker and/or audio output jack. The signal processing and/or control circuits 1204 and/or other circuits (not shown) of the media player 1200 may process data, perform coding and/or encryption, perform calculations, format data and/or perform any other media player function.

The media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 1200 may be connected to memory 1214 such as RAM, ROM, low latency nonvolatile memory such as flash memory and/or other suitable electronic data storage. The media player 1200 also may support connections with a WLAN via a WLAN network interface 1216. Still other implementations in addition to those described above are contemplated.

The foregoing describes systems and methods for improving the burst error correction capability of iterative decoders. One skilled in the art will appreciate that the invention can be practiced by other than the described embodiments, which are presented for purposes of illustration and not of limitation, and the present invention is limited only by the claims that follow.

What is claimed is:

1. A method for decoding data, the method comprising:
    acquiring a first set of information for a plurality of error correction code (ECC)-encoded data symbols;
    acquiring a second set of information for the plurality of ECC-encoded data symbols;
    selecting a window including at least a subset of the plurality of ECC-encoded data symbols;
    determining a likelihood of a burst error in the window based, at least in part, on a portion of the first set of information and a portion of the second set of information; and
    updating the second set of information for selected data symbols of the subset based on the likelihood of a burst error in the window.

2. The method of claim 1, wherein the error correction code is a low-density parity-check code.

3. The method of claim 1, wherein the error correction code is a turbo code.

4. The method of claim 1, wherein the first set of information comprises extrinsic information, and the second set of information comprises channel information.

5. The method of claim 4, wherein updating channel information comprises erasing channel information for the selected data symbols.

6. The method of claim 4, further comprising repeating:
    selecting a window;
    determining a likelihood of a burst error in the window; and
    updating channel information for selected data symbols of the subset in the window.

7. The method of claim 6, wherein the repeating continues until a completion condition is met.

8. The method of claim 7, wherein the completion condition includes performing the updating on all data symbols of the plurality of ECC-encoded data symbols.

9. The method of claim 4, wherein the determining a likelihood of a burst error in the window further comprises:
    calculating extrinsic hard decision data based on the portion of the extrinsic information;
    calculating channel hard decision data based on the portion of the channel information;
    selecting a portion of the data symbols from the subset such that extrinsic hard decision data for respective data symbols of the portion of the data symbols is distinct from channel hard decision data for respective data symbols of the portion of the data symbols; and
    determining whether at least one condition has been met based on the portion of the data symbols.

10. The method of claim 9, wherein the at least one condition includes exceeding a selected threshold for a size of the portion of the data symbols.

11. The method of claim 10, wherein the size includes the number of data symbols in the portion of data symbols from the subset.

12. The method of claim 10, further comprising conditionally adjusting the selected threshold based on selected information available from burst error detection circuitry.

13. The method of claim 9, further comprising calculating a magnitude of extrinsic information for the portion of the data symbols, and wherein the at least one condition includes exceeding a selected threshold for the magnitude.

14. The method of claim 13, further comprising conditionally adjusting the selected threshold based on selected information available from burst error detection circuitry.

15. The method of claim 9, further comprising:
    determining a first most likely symbol value for respective data symbols in the portion of the data symbols based on at least the portion of the extrinsic information;
    determining a second most likely symbol value for respective data symbols in the portion of the data symbols based on at least the portion of the extrinsic information; and
    calculating a sum of differences between extrinsic information corresponding to the first most likely symbol value and extrinsic information corresponding to the second most likely symbol value for respective data symbols in the portion of the data symbols.

16. The method of claim 15, wherein the at least one condition includes exceeding a selected threshold for the sum of the differences.

17. The method of claim 16, further comprising conditionally adjusting the selected threshold based on selected information available from burst error detection circuitry.

18. The method of claim 9, further comprising:
    determining a first most likely symbol value for respective data symbol in the portion of the data symbols based on the portion of the extrinsic information;
    determining a second most likely symbol value for respective data symbols in the portion of the data symbols based on the portion of the channel information; and
    calculating a sum of differences between extrinsic information corresponding to the first most likely symbol value for a selected data symbol and extrinsic information corresponding to the second most likely symbol value for the selected data symbol for respective data symbols in the portion of the data symbols.

19. The method of claim 18, wherein the at least one condition includes exceeding a selected threshold for the sum of differences.

20. The method of claim 19, further comprising conditionally adjusting the selected threshold based on selected information available from burst error detection circuitry.

21. A system for decoding data, the system comprising:
    an error correction coding decoder for acquiring a first set of information for a plurality of error correction code (ECC)-encoded data symbols;
    a receiver for acquiring a second set of information for the plurality of ECC-encoded data symbols;
    a selection module for selecting a window including a subset of the plurality of ECC-encoded data symbols;
    a determination module for determining a likelihood of a burst error in the window based, at least in part, on a portion of the first set of information and a portion of the second set of information; and
    an updating module for updating the second set of information for selected data symbols of the subset based on the likelihood of a burst error in the window.

22. The method of claim 21, wherein the determination module further comprises burst error detection circuitry.

23. The method of claim 21, wherein the error correction code is a low-density parity-check code.

24. The system of claim 21, wherein the error correction code is a turbo code.

25. The method of claim 21, wherein the first set of information comprises extrinsic information, and the second set of information comprises channel information.

26. The system of claim 25, wherein updating channel information comprises erasing channel information for the selected data symbols.

27. The system of claim 25, wherein determining a likelihood of a burst error comprises:
- calculating extrinsic hard decision data based on the portion of the extrinsic information;
- calculating channel hard decision data based on the portion of the channel information;
- selecting a portion of the data symbols from the subset such that the extrinsic hard decision data for respective data symbols of the portion of the data symbols is distinct from the channel hard decision data for respective data symbols of the portion of the data symbols; and
- determining whether at least one condition has been met based on the portion of the data symbols.

28. The system of claim 27, wherein the at least one condition includes exceeding a selected threshold for a size of the portion of the data symbols.

29. The system of claim 28, wherein the size includes the number of data symbols in the portion of data symbols from the subset.

30. The system of claim 28, wherein the selected threshold is conditionally adjusted based on selected information available from burst error detection circuitry.

31. The system of claim 27, wherein determining a likelihood of a burst error further comprises calculating a magnitude of extrinsic information for the portion of the data symbols, and wherein a condition of the at least one condition includes exceeding a selected threshold for the magnitude.

32. The system of claim 31, wherein the selected threshold is conditionally adjusted based on selected information available from burst error detection circuitry.

33. The system of claim 27, wherein determining a likelihood of a burst error further comprises:
- determining a first most likely symbol value for respective data symbols in the portion of the data symbols based on at least the portion of the extrinsic information;
- determining a second most likely symbol value for respective data symbols in the portion of the data symbols based on at least the portion of the extrinsic information; and
- calculating a sum of differences between extrinsic information corresponding to the first most likely symbol value and extrinsic information corresponding to the second most likely symbol value for respective data symbols in the portion of the data symbols; and
- wherein a condition of the at least one condition includes exceeding a selected threshold for the sum of differences.

34. The system of claim 33, wherein the selected threshold is conditionally adjusted based on selected information available from burst error detection circuitry.

35. The system of claim 27, wherein determining a likelihood of a burst error further comprises:
- determining a first most likely symbol value for respective data symbols in the portion of the data symbols based on at least the portion of the extrinsic information;
- determining a second most symbol likely value for respective data symbols in the portion of the data symbols based on at least the portion of the channel information;
- calculating a sum of differences between extrinsic information corresponding to the first most likely symbol value for a selected data symbol and extrinsic information corresponding to the second most likely symbol value for the selected data symbol based on the portion of the channel information for respective data symbols in the portion of the data symbols; and
- wherein a condition of the at least one condition includes exceeding a selected threshold for the sum of differences.

36. The system of claim 35, wherein the selected threshold is conditionally adjusted based on selected information available from burst error detection circuitry.

37. The system of claim 27, wherein the determination module further comprises burst error detection circuitry.

* * * * *